(12) United States Patent
Adachi

(10) Patent No.: US 9,692,401 B2
(45) Date of Patent: Jun. 27, 2017

(54) SKEW ADJUSTMENT CIRCUIT AND SKEW ADJUSTMENT METHOD

(71) Applicant: MegaChips Corporation, Osaka (JP)

(72) Inventor: Shingo Adachi, Chiba (JP)

(73) Assignee: MegaChips Corporation, Osaka (JP)

(*) Notice: Subject to any disclaimer, the term of this patent is extended or adjusted under 35 U.S.C. 154(b) by 0 days.

(21) Appl. No.: 14/937,247

(22) Filed: Nov. 10, 2015

(65) Prior Publication Data
US 2016/0134267 A1 May 12, 2016

(30) Foreign Application Priority Data

Nov. 10, 2014 (JP) .................................. 2014-228021

(51) Int. Cl.
*H03K 5/13* (2014.01)
*H03K 5/159* (2006.01)

(52) U.S. Cl.
CPC .................................. *H03K 5/159* (2013.01)

(58) Field of Classification Search
None
See application file for complete search history.

(56) References Cited

U.S. PATENT DOCUMENTS

2002/0009169 A1* 1/2002 Watanabe ............... H04L 25/14
375/371

FOREIGN PATENT DOCUMENTS

| JP | H05-235923 A | 9/1993 |
| JP | 2009-152682 A | 7/2009 |
| JP | 2014-089664 A | 5/2014 |

* cited by examiner

*Primary Examiner* — Cassandra Cox
(74) *Attorney, Agent, or Firm* — Osha Liang LLP

(57) ABSTRACT

A skew adjustment circuit comprises a phase adjustment circuit that adjusts a phase of a first input clock based on a predetermined phase control signal, and outputs it as an output clock, a logical circuit that performs a logical operation between signals that are input, an integral circuit that generates a predetermined voltage signal, based on a result of the logical operation by the logical circuit, a comparator that compares an electric potential of the predetermined voltage signal and an electric potential of a predetermined reference voltage signal, a first controller that generates the predetermined phase control signal based on a result of the comparison by the comparator, and a second controller that performs control for selecting a signal that is to be input to the logical circuit. The second controller, in a first mode, performs the control such that the output clock and a second input clock are selected.

14 Claims, 23 Drawing Sheets

TIMING CHART WHEN THERE IS NO SKEW AMONG MULTIPHASE INPUT CLOCKS IN

TIMING CHART WHEN THERE ARE SKEWS AMONG MULTIPHASE INPUT CLOCKS IN

TIMING CHART WHEN SKEW FOR INPUT CLOCK IN(4) IS ADJUSTED

TIMING CHART WHEN SKEWS FOR INPUT CLOCKS IN(3) AND IN(4) ARE ADJUSTED

TIMING CHART WHEN SKEWS FOR INPUT CLOCKS IN(2) TO IN(4) ARE ADJUSTED

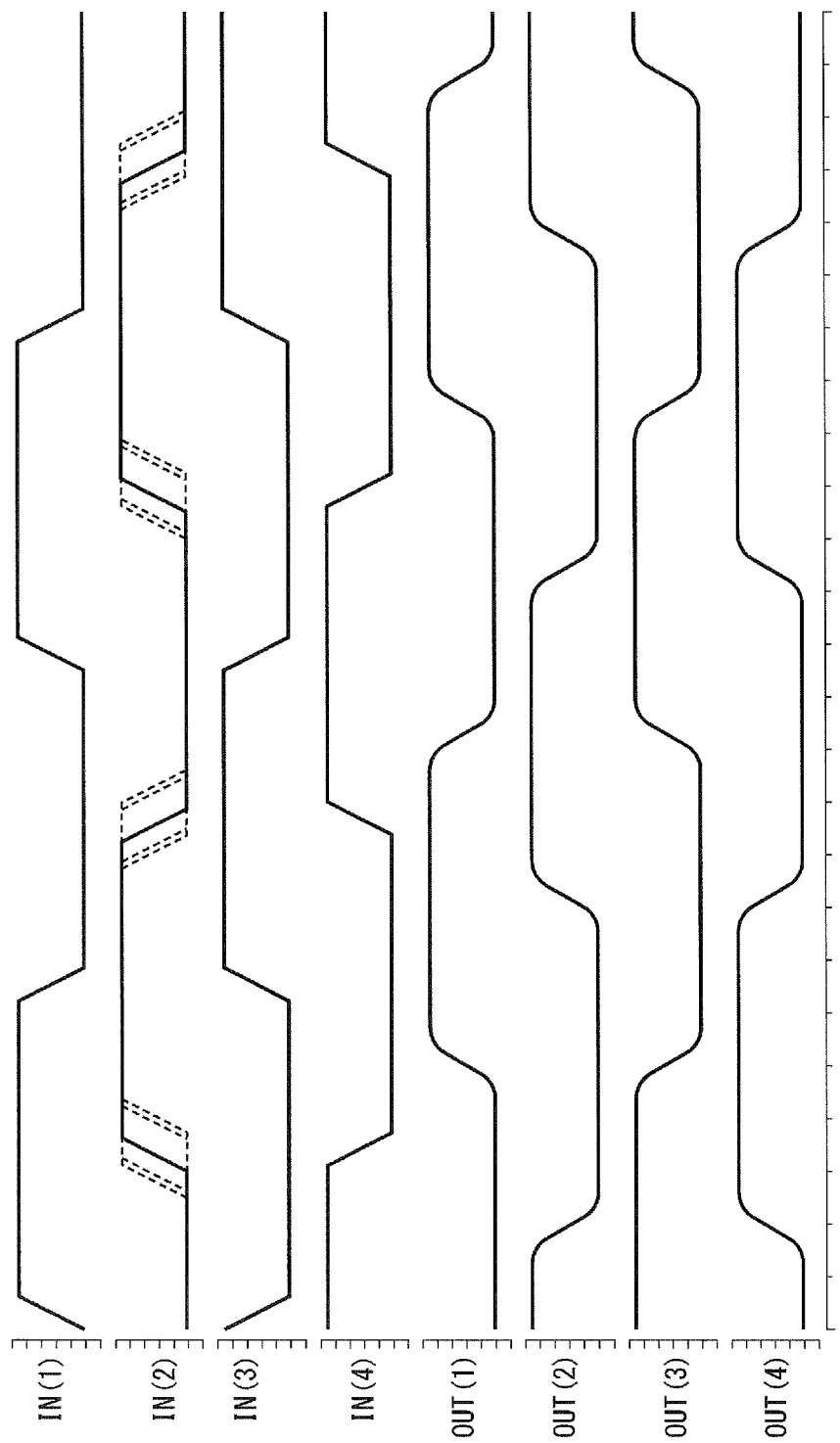

SKEW ADJUSTMENT CIRCUIT AND SKEW ADJUSTMENT METHOD

FIELD OF THE INVENTION

The present invention relates to skew adjustment circuits and methods, and particularly relates to a skew adjustment circuit and a skew adjustment method for adjusting a skew between multiphase clock signals.

BACKGROUND OF THE INVENTION

Conventionally, in semiconductor integrated circuits having high-speed transmission paths, multiphase clocks are widely used because they allow for a precise adjustment of a clock skew (a deviation of the timings when clocks reach nodes of a semiconductor integrated circuit; sometimes called a timing skew; hereinafter, it is referred to as the "skew"), compared to a single-phase clock Therefore, multiphase clocks have an important role in semiconductor integrated circuits having high-speed transmission paths.

As the semiconductor integrated circuit using multiphase clocks, typically, there are a scheme of generating multiphase clocks in a transmitter and transmitting the multiphase clocks to a receiver, and a scheme of generating multiphase clocks in a receiver based on a single-phase clock transmitted from a transmitter. In the former scheme, it is necessary to adjust a skew generated between the multiphase clocks having reached the receiver through high-speed transmission paths. In the latter scheme, it is necessary to use, as a frequency of the single-phase clock, a multiplied frequency of a frequency of the multiphase clocks. Conventionally, in the former scheme, it is very difficult to adjust such a skew generated between the multiphase clocks having reached the receiver, and therefore, the latter scheme has been generally used.

For example, Japanese Patent Publication No. H5-235923 discloses a phase adjustment circuit comprising a regenerating circuit and a differential delay circuit that receive a receiving signal, a timing extraction filter that receives an output of the differential delay circuit, and a phase-variable circuit that adjusts a phase of a clock signal that is output by the timing extraction filter. The phase adjustment circuit is used for adjusting the phase of the clock signal in an optical receiver configured such that a regeneration circuit latches a data signal in accordance with the clock signal output by the phase-variable circuit. The phase adjustment circuit further includes a first exclusive-or circuit that detects a phase difference between an input signal and an output signal of the regeneration circuit, a second exclusive-or circuit that receives an output of the differential delay circuit and an output of the first exclusive-or circuit, and a comparator that receives an output of the second exclusive-or circuit through a low-pass filter, and is configured to use, as a control signal for the phase-variable circuit, a signal that the comparator outputs with reference to a predetermined reference signal.

Further, for example, Japanese Patent Publication No. 2014-89664 discloses a skew adjustment circuit that adjusts a skew between clocks using an exclusive-or is disclosed. The skew adjustment circuit includes a first delay circuit that delays a first clock signal, a second delay circuit that delays a second clock signal having a different phase from the first clock signal, a third delay circuit that delays a third clock signal having a middle phase between the first clock signal and the second clock signal, a first logic gate that obtains the exclusive-or between an output of the first delay circuit and an output of the third delay circuit, a second logic gate that obtains the exclusive-or between an output of the second delay circuit and an output of the third delay circuit, and a feedback path that supplies, to the third delay circuit, a feedback voltage for adjusting delay time in the third delay circuit based on the difference between an output of the first logic gate and an output of the second logic gate.

Furthermore, for example, Japanese Patent Publication No. 2009-152682 discloses a phase difference smoother that reduces a phase error of multiphase clocks. The phase difference smoother includes phase filter circuits having weighting means for receiving multiple clocks that are of input multiphase clocks and that have a desired phase relation and performing a desired weighting for a phase of each clock and adding means for adding the weighted clocks, the number of which is equivalent to the number of the phases of the multiphase clocks, and outputs, as an output multiphase clock, a clock output from the phase filter circuit.

SUMMARY OF THE INVENTION

Recently, with a further speed-up of clocks, semiconductor integrated circuits are demanded to operate at very high speeds (e.g., 5 GHz or more). Therefore, in the semiconductor integrated circuit that operates at a very high speed, it has been difficult to control a single-phase clock having a multiplied frequency of a frequency of multiphase clocks.

In such conventional circuits disclosed in Japanese Patent Publication No. 5-235923 and Japanese Patent Publication No. 2014-89664, the exclusive-or gates are used in circuits for detecting the skew (phase difference) between the multiphase clocks. In the case of two inputs, the exclusive-or gate outputs a state of "1" at two timings: the timing when the states of the two input signals become states of "1" and "0" and the timing when they become states of "0" and "1." The exclusive-or gate, due to a property variation thereof or the like, sometimes outputs the state of "1" at deviated timings with respect to one or both timings of the two timings. In such a case, the electric potential of the output of the low-pass filter becomes a desired electric potential, although the skew between the two input signals is not a desired skew actually. This is a negligible problem in such conventional semiconductor integrated circuits that do not operate at a very high speed, but is a non-negligible problem in a semiconductor integrated circuit that operates at a very high speed.

Further, in a semiconductor integrated circuit that operates at a very high speed, a property variation of a circuit itself that detects a skew also has become non-negligible. Therefore, such a circuit is demanded to have a calibration function for suppressing the property variation by calibrating the property variation. As discussed above, the conventional circuits disclosed in Japanese Patent Publication No. H5-235923 and Japanese Patent Publication No. 2014-89664 use the exclusive-or gates in the circuits for detecting the skew between the multiphase clocks, and the conventional circuit disclosed in Japanese Patent Publication No. 2009-152682 does not allow for such suppression of the property variation of the circuit itself at all. Therefore, there is a problem in that a skew between multiphase clocks cannot be adjusted with high accuracy.

The present invention has an object to provide a skew adjustment circuit and a skew adjustment method that can adjust a skew between multiphase clocks with high accuracy, in the semiconductor integrated circuit that operates at a very high speed.

Further, the present invention has an object to provide a skew adjustment circuit and a skew adjustment method that have a self-calibration function and that can adjust a skew between multiphase clocks with high accuracy.

The present invention for solving the above problems may be configured to include the following technical features or invention-specifying matters.

According to an aspect, the present invention may be a skew adjustment circuit including a phase adjustment circuit that adjusts a phase of a first input clock based on a predetermined phase control signal, and outputs the adjusted first input clock as an output clock, a logical circuit that performs a logical operation between signals that are input, an integral circuit that generates a predetermined voltage signal based on a result of the logical operation by the logical circuit, a comparator that compares an electric potential of the predetermined voltage signal and an electric potential of a predetermined reference voltage signal, a phase adjustment amount controller that generates the predetermined phase control signal, based on a result of the comparison by the comparator, and a controller that performs control to select a signal to be input to the logical circuit. The controller, in a first mode, performs control such that the output clock and a second input clock are selected.

Further, the logical circuit may perform a logical product between the signals that are input.

The skew adjustment circuit may further include a voltage controller that generates the predetermined reference voltage signal based on the result of the comparison. The controller, in a second mode, may perform the control such that the first input clock is selected. The voltage controller may perform control so as to raise the electric potential of the predetermined reference voltage signal by a predetermined value when the result of the comparison indicates that the electric potential of the predetermined voltage signal is greater than the electric potential of the predetermined reference voltage signal, and to hold the electric potential of the predetermined reference voltage signal when the result of the comparison indicates that the electric potential of the predetermined voltage signal is not greater than the electric potential of the predetermined reference voltage signal.

Further, the phase adjustment amount controller may perform control so as to raise an electric potential of the predetermined phase control signal by a predetermined value when the result of the comparison indicates that the electric potential of the predetermined voltage signal is greater than the electric potential of the predetermined reference voltage signal, and to hold the electric potential of the predetermined phase control signal when the result of the comparison indicates that the electric potential of the predetermined voltage signal is not greater than the electric potential of the predetermined reference voltage signal.

Furthermore, the present invention according to another aspect may be a multiphase skew adjustment circuit including a plurality of skew adjustment circuits, each of which adjusts a skew between multiphase clocks. The multiphase clocks may have a predetermined phase difference from each other. Each of the plurality of skew adjustment circuits may include a first input terminal, a second input terminal, an output terminal, a phase adjustment circuit that adjusts a phase of a first input clock that is input to the first input terminal based on a predetermined comparison signal, and outputs the adjusted first input clock from the output terminal as an output clock, a logical circuit that performs a logical operation between the output clock and a second input clock that is input to the second input terminal, an integral circuit that generates a predetermined voltage signal based on a result of the logical operation by the logical circuit, a comparator that compares an electric potential of the predetermined voltage signal and an electric potential of a predetermined reference voltage signal, and a phase adjustment amount controller that generates the predetermined phase control signal based on a result of the comparison by the comparator. One of the skew adjustment circuits may receive, through the first input terminal, the first input clock having a predetermined phase difference relative to a first input clock that is input to the first input terminal of the skew adjustment circuit at the previous stage, and receive, through the second input terminal, the output clock that is output from the output terminal of the skew adjustment circuit at the subsequent stage.

The logical circuit may perform a logical product between the output clock and the second input clock that is input to the second input terminal.

Further, the skew adjustment circuit at the last stage of the plurality of skew adjustment circuits may be configured to receive, through the second input terminal, the output clock that is output from the output terminal of the skew adjustment circuit at the first stage.

Furthermore, the present invention according to another aspect may be a multiphase skew adjustment circuit including a plurality of skew adjustment circuits, each of which adjusts a skew between multiphase clocks. The multiphase clocks may have a predetermined phase difference from each other. Each of the plurality of skew adjustment circuits may include a first input terminal, a second input terminal, an output terminal, a phase adjustment circuit that adjusts a phase of a first input clock that is input to the first input terminal based on a predetermined comparison signal and outputs the adjusted first input clock from the output terminal as an output clock, a logical circuit that performs a logical operation between the output clock and a second input clock that is input to the second input terminal, an integral circuit that generates a predetermined voltage signal based on a result of the logical operation by the logical circuit, a comparator that compares an electric potential of the predetermined voltage signal and an electric potential of a predetermined reference voltage signal, and a controller that generates the predetermined phase control signal, based on a result of the comparison by the comparator. One of the skew adjustment circuits may receive, through the first input terminal, the first input clock having a predetermined phase difference relative to a first input clock that is input to the first input terminal of the skew adjustment circuit at the previous stage, and receive, through the second input terminal, the output clock that is output from the output terminal of the skew adjustment circuit at the previous stage.

The logical circuit may perform a logical product between the output clock and the second input clock that is input to the second input terminal.

Further, the multiphase skew adjustment circuit may be configured such that a desired electric potential is input to the second input terminal of the skew adjustment circuit at the first stage that is the one skew adjustment circuit.

Furthermore, the present invention according to another aspect may be a method for adjusting a skew between multiphase clocks in a multiphase skew adjustment circuit including a plurality of skew adjustment circuits that are connected in a multistage manner. The method comprises adjusting a skew between an output clock that is output from a skew adjustment circuit performing a skew adjustment and an output clock from another skew adjustment circuit that is input to the skew adjustment circuit. The adjusting the skew may include first adjusting a skew between an output clock that is output from the skew adjustment circuit at the last stage and an output clock that is output from the skew adjustment circuit at the first stage and that is input to the skew adjustment circuit at the last stage, and second adjusting a skew between an output clock that is output from one skew adjustment circuit and an output clock that is output from the skew adjustment circuit at the subsequent stage of the one skew adjustment circuit and that is input to the one skew adjustment circuit. The second adjusting the skew may be repeated in descending order from the skew adjustment circuit at the previous stage of the last stage.

The skew adjustment method for the multiphase clocks may further comprise calibrating a predetermined phase control signal in each of the plurality of skew adjustment circuits. The calibrating may comprise setting an electric potential of a predetermined reference voltage signal to an initial value, comparing an electric potential of a predetermined voltage signal and the electric potential of the predetermined reference voltage signal, which may be based on a first input clock that is input externally, and raising the electric potential of the predetermined reference voltage signal by a predetermined value, when the electric potential of the predetermined voltage signal is greater than the electric potential of the predetermined reference voltage signal as a result of the comparison. The comparing and the raising may be repeated until the electric potential of the predetermined voltage signal becomes not greater than the electric potential of the predetermined reference voltage signal as a result of the comparison. In addition, the electric potential of the predetermined reference voltage signal may be held when the electric potential of the predetermined voltage signal becomes not greater than the electric potential of the predetermined reference voltage signal as a result of the comparison.

Further, the adjusting the skew may comprise setting a phase of the output clock that is output by the skew adjustment circuit performing the skew adjustment, to an initial value, detecting a phase difference between the output clock that is output by the skew adjustment circuit performing the skew adjustment and the output clock that is input to the skew adjustment circuit performing the skew adjustment; comparing an electric potential of a predetermined voltage signal and an electric potential of a predetermined reference voltage signal, which may be based on the detected phase difference, and altering the phase of the output clock that is output by the one skew adjustment circuit, by a predetermined value, when the electric potential of the predetermined voltage signal is greater than the electric potential of the predetermined reference voltage signal as a result of the comparison. The detecting of the phase difference, the comparing and the altering may be repeated until the electric potential of the predetermined voltage signal becomes not greater than the electric potential of the predetermined reference voltage signal as a result of the comparison. Further, the phase of the output clock that is output by the skew adjustment circuit performing the skew adjustment may be held when the electric potential of the predetermined voltage signal is not greater than the electric potential of the predetermined reference voltage signal as a result of the comparison.

Furthermore, the present invention according to another aspect may be a method for adjusting a skew between multiphase clocks in a multiphase skew adjustment circuit including a plurality of skew adjustment circuits that are connected in a multistage manner. The method may comprise adjusting a skew between an output clock that is output from one skew adjustment circuit and an output clock that is output from the skew adjustment circuit at the previous stage of the one skew adjustment circuit and that is input to the one skew adjustment circuit. The adjusting may be repeated in ascending order from the skew adjustment circuit at the subsequent stage of the first stage.

According to the present invention, the skew adjustment circuit can adjust the skew between multiphase clocks with high accuracy, in the semiconductor integrated circuit that operates at a very high speed.

Further, according to the present invention, the skew adjustment circuit may have a self-calibration function, and thereby, may calibrate the property variation of itself. Thereby, it is possible to suppress the property variation, and therefore, to adjust the skew between multiphase clocks with high accuracy.

Other technical features, objects, operations, effects and advantages of the present invention will be revealed by the following embodiments, which will be described with reference to the accompanying drawings.

BRIEF DESCRIPTION OF THE DRAWINGS

FIG. 21 is a timing chart of various signals in a multiphase skew adjustment circuit according to the embodiment.

DETAILED DESCRIPTION OF THE PREFERRED EMBODIMENTS

Embodiments of the present invention will be described with reference to the drawings.

Figure 1A:
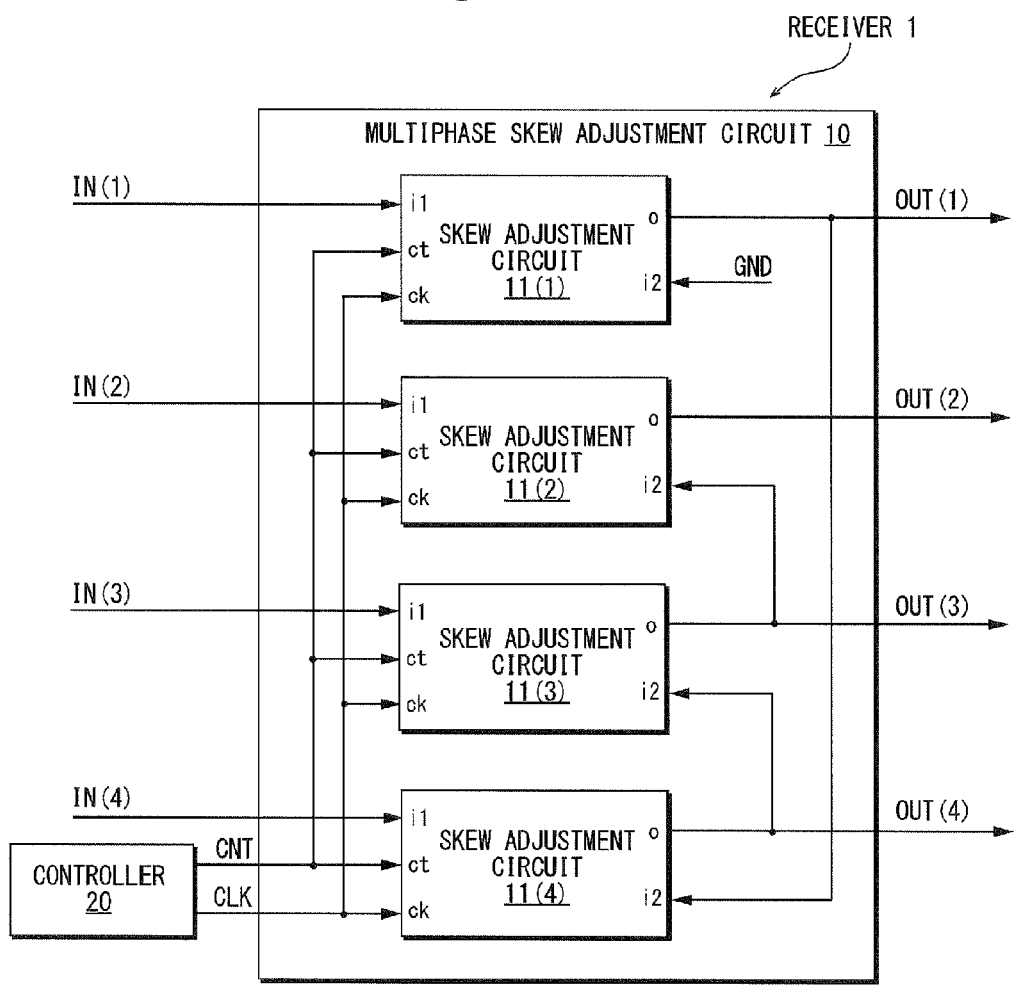
FIG. 1A is a diagram showing an example of a schematic configuration of a receiver according to an embodiment of the present invention.

FIG. 1A is a diagram showing an example of a schematic configuration of a receiver according to an embodiment of the present invention. As shown in FIG. 1A, a receiver 1 of this embodiment may be configured to include, for example, a multiphase skew adjustment circuit 10 and a controller 20.

The multiphase skew adjustment circuit 10 may receive multiphase input clocks IN, adjust, based on a reference clock CLK, a skew generated between the multiphase input clocks IN, in accordance with a control signal CNT output from the controller 20, and output a result of the adjustment to the outside as multiphase output clocks OUT. For example, the multiphase skew adjustment circuit 10 may be configured to include a plurality of skew adjustment circuits $11(x)$ (x is a number for identifying the skew adjustment circuits 11). In this example, four skew adjustment circuits 11(1) to 11(4) are shown. Hereinafter, when it is not particularly necessary to discriminate the plurality of skew adjustment circuits $11(x)$, they are sometimes referred to as the skew adjustment circuits 11.

More specifically, in the multiphase skew adjustment circuit 10, the skew adjustment circuit $11(x)$ (here, $x \neq 1$, $x \neq 2$) may receive an input clock IN(x) through an input terminal i1, receive, through an input terminal i2, an output clock OUT(x+1) of which the phase has been adjusted in the skew adjustment circuit $11(x+1)$ at the next stage, adjust the skew between the two clocks in accordance with the control signal CNT output from the controller 20, based on the reference clock CLK output from the controller 20, and output the clock, as an output clock OUT(x), from an output terminal o to the exterior and an input terminal i2 of the skew adjustment circuit $11(x-1)$ at the previous stage.

Further, the skew adjustment circuit 11(2) may receive an input clock IN(2) through an input terminal i1, may receive, through an input terminal i2, an output clock OUT(3) of which the phase has been adjusted in the skew adjustment circuit 11(3) at the next stage, adjust the skew between the two clocks in accordance with the control signal CNT output from the controller 20, based on the reference clock CLK output from the controller 20, and output the clock, as an output clock OUT(2), from an output terminal o to the exterior.

Further, the skew adjustment circuit 11(x_max) (x_max is the total number of the skew adjustment circuits 11) at the last stage may receive an input clock IN(x_max) through an input terminal i1, receive, through an input terminal i2, an output clock OUT(1) output from the skew adjustment circuit 11(1) at the first stage, adjust the skew between the two clocks in accordance with the control signal CNT output from the controller 20, based on the reference clock CLK output from the controller 20, and output the clock, as an output clock OUT(x_max), from an output terminal o to the exterior and an input terminal i2 of the skew adjustment circuit 11(x_max−1). Further, to an input terminal i2 of the skew adjustment circuit 11(1) at the first stage, the electric potential of a grounding line GND may be input, because simply the self-calibration for the reference clock CLK may be performed and the skew adjustment between the skew adjustment circuits 11 may not be performed.

In this embodiment, the multiphase skew adjustment circuit 10 is configured to include the four skew adjustment circuits 11(1) to 11(4), but without being limited to this, may be configured by an arbitrary number of skew adjustment circuits 11. Further, in this embodiment, the electric potential of the grounding line GND is input to the input terminal i2 of the skew adjustment circuit 11(1) at the first stage, but without being limited to this, a desired electric potential may be input.

The controller 20 may control each skew adjustment circuit 11 of the multiphase skew adjustment circuit 10. The controller 20 may output the control signal CNT, which may indicate one of operation modes (e.g., a normal operation mode, a self-calibration mode and a skew adjustment mode) of each skew adjustment circuit 11, and the reference clock CLK, which may be reference or a criteria when each constituent element of the skew adjustment circuit 11 operates, to each skew adjustment circuit 11 of the multiphase skew adjustment circuit 10.

Specifically, the controller 20, first, may set each skew adjustment circuit 11 to the self-calibration mode, by the control signal CNT. In accordance with the control signal CNT indicating the self-calibration mode, the skew adjustment circuit 11 may calibrate property variation thereof. Next, by the control signal CNT, the controller 20 may sequentially set the skew adjustment circuits 11(2) to 11(x_max) to the skew adjustment mode, in descending order from the last stage. By way of this, in accordance with the control signal CNT indicating the skew adjustment mode, the skew adjustment circuit 11(x_max) may adjust the skew between the input clock IN(x_max) and the output clock OUT(1) of the skew adjustment circuit 11(1), and store the result of the adjustment, as the setting. After such adjustment is completed, the skew adjustment circuit 11(x_max−1), in accordance with the control signal CNT indicating the skew adjustment mode, may adjust the skew between the input clock IN(x_max−1) and the output clock OUT(x_max) of the skew adjustment circuit 11(x_max), and store the result of the adjustment, as the setting. Thereafter, similarly, the skew adjustment circuit 11(x_max−2) may adjust the skew between the input clock IN(x_max−2) and the output clock OUT(x_max−1), and store the result of the adjustment, as the setting. Finally, the controller 20 may set each skew adjustment circuit 11 to the normal operation mode, by the control signal CNT indicating the normal operation mode. In accordance with the control signal CNT indicating the normal operation mode, each skew adjustment circuit 11 may perform the skew adjustment for the input clock IN, in the setting stored in the skew adjustment mode, and output the output clock OUT to the exterior. The detail of the control method for the multiphase skew adjustment circuit 10 by the controller 20 will be described later.

The receiver 1 configured as described above may receive the multiphase input clocks IN, adjust the skew generated between the multiphase input clocks IN, in accordance with the control signal CNT output from the controller 20, and output the clocks after the skew adjustment, as the multiphase output clocks OUT. Thus, the receiver 1 may adjust the skew generated between the multiphase clocks IN.

Figure 1B:
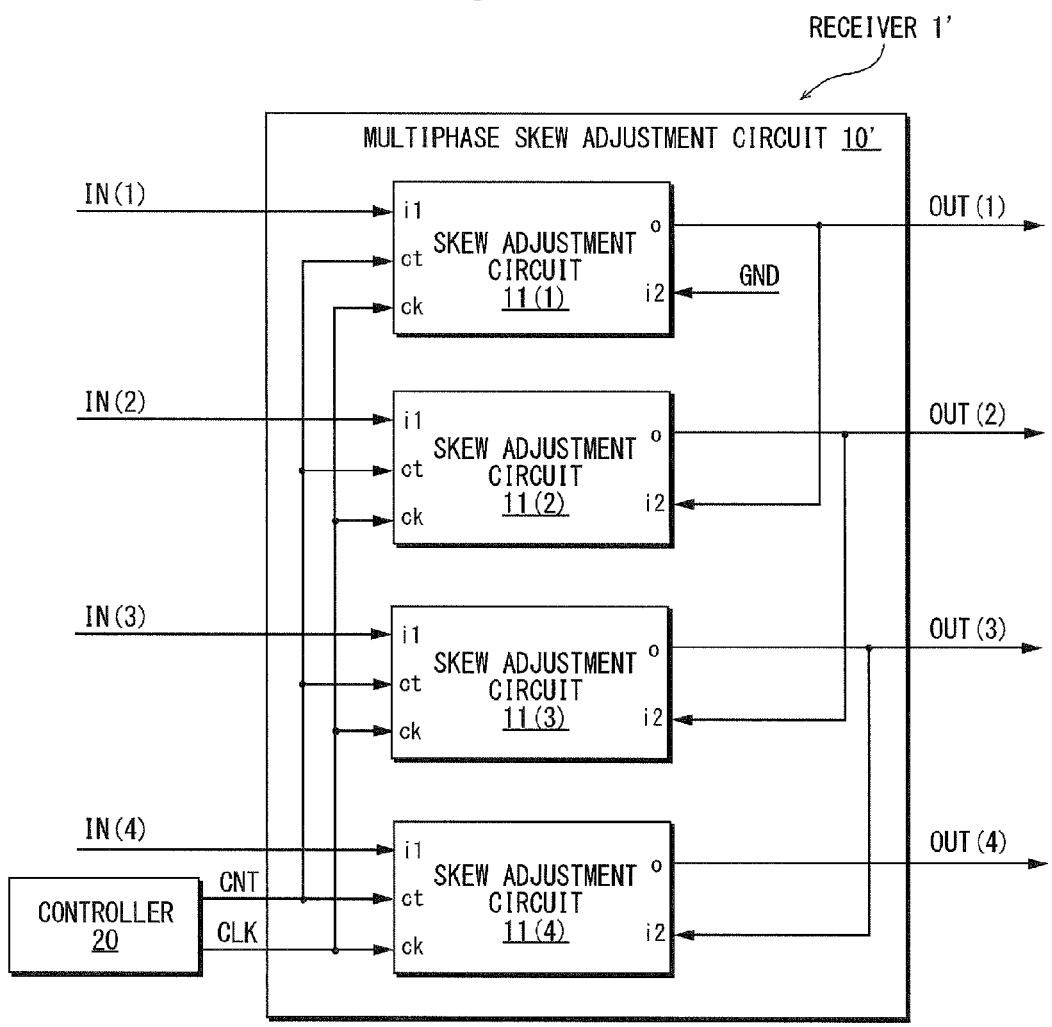
FIG. 1B is a diagram showing another example of a schematic configuration of a receiver according to an embodiment of the present invention.

FIG. 1B is a diagram showing another example of a schematic configuration of a receiver according to an embodiment of the present invention. As shown in FIG. 1B, in a receiver 1' according to an embodiment, a connective relation of the multiple skew adjustment circuits 11 in a multiphase skew adjustment circuit 10' is different from the connective relation shown in FIG. 1A, and thus, control of the controller 20 is also different, as described below.

That is, in the multiphase skew adjustment circuit 10', the skew adjustment circuit 11(x) (here, x≠1) may receive the input clock IN(x) through the input terminal i1, receive, through the input terminal i2, the output clock OUT(x−1) of which the phase has been adjusted in the skew adjustment circuit 11(x−1), adjust the skew between the two clocks in accordance with the control signal CNT output from the controller 20, based on the reference clock CLK output from the controller 20, and output the clock, as the output clock OUT(x), from the output terminal o to the exterior and the input terminal i2 of the skew adjustment circuit 11(x+1). Further, similarly to the multiphase skew adjustment circuit 10, electric potential of the grounding line GND may be input to the input terminal i2 of the skew adjustment circuit 11(1) at the first stage.

As described above, the controller 20, first, may set each skew adjustment circuit 11 to the self-calibration mode, by the control signal CNT. In accordance with the control signal CNT indicating the self-calibration mode, the skew adjustment circuit 11 may calibrate the property variation thereof. Next, by the control signal CNT, the controller 20 may sequentially set the skew adjustment circuits 11(2) to 11(x_max) to the skew adjustment mode, in ascending order from the second stage. In accordance with the control signal CNT indicating the skew adjustment mode, the skew adjustment circuit 11(2) may adjust the skew between the input clock IN(2) and the output clock OUT(1) of the skew adjustment circuit 11(1), and store the result of the adjustment, as the setting. After this adjustment is completed, the skew adjustment circuit 11(3), in accordance with the control signal CNT indicating the skew adjustment mode, may adjust the skew between the input clock IN(3) and the output clock OUT(2) of the skew adjustment circuit 11(2), and store the result of the adjustment, as the setting. Thereafter, similarly, the skew adjustment circuit 11(x_max) may adjust the skew between the input clock IN(x_max) and the output clock OUT(x_max−1), and store the result of the adjustment, as the setting. Finally, as described above, the controller 20 may set each skew adjustment circuit 11 to the normal operation mode, by the control signal CNT. In accordance with the control signal CNT indicating the normal operation mode, each skew adjustment circuit 11 may perform the skew adjustment for the input clock IN, in the setting stored in the skew adjustment mode, and output the output clock OUT to the exterior.

The receiver 1' configured as described above can also adjust the skew generated between the multiphase input clocks IN, and can output them as the multiphase output clocks OUT.

Figure 2:
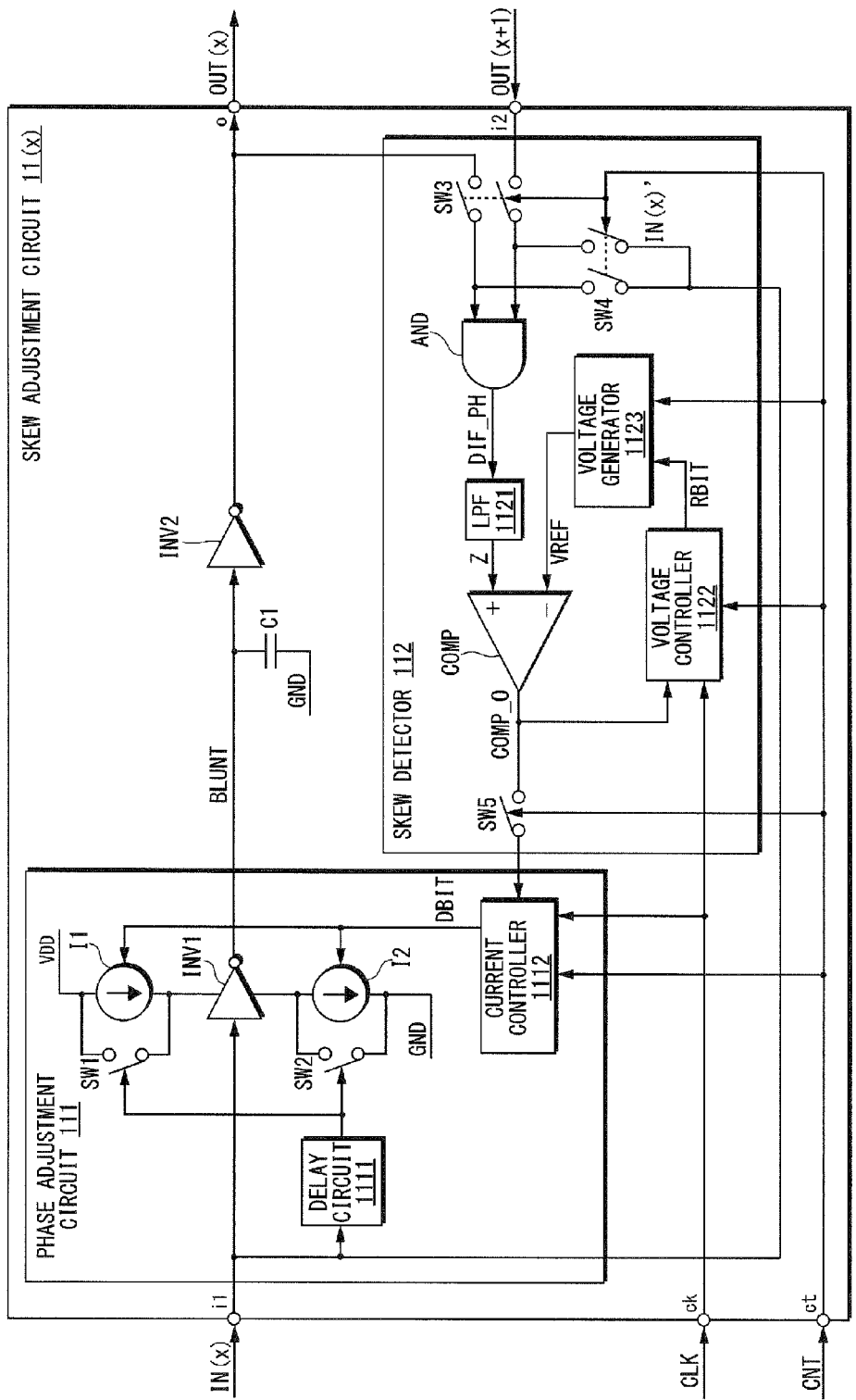
FIG. 2 is a diagram showing an example of a skew adjustment circuit of a multiphase skew adjustment circuit according to an embodiment of the present invention.

FIG. 2 is a diagram showing an example of a skew adjustment circuit of a multiphase skew adjustment circuit according to an embodiment of the present invention. As shown in FIG. 2, the skew adjustment circuit 11(x) (here, x≠1) according to this embodiment may be configured to include a phase adjustment circuit 111, a capacitance element C1, a logical negation circuit INV2, and a skew detector 112. The description will be made on assumption of the multiphase skew adjustment circuit 10 shown in FIG. 1A, but it should be understood that a person skilled in the art can similarly perform the application to the multiphase skew adjustment circuit 10' shown in FIG. 1B.

The phase adjustment circuit 111, for the input clock IN(x) input to the input terminal i1 of the skew adjustment circuit 11(x), may adjust a waveform and thereby adjust a phase, by controlling current values of current sources I1 and I2 in accordance with a comparison signal COMP_O output from the skew detector 112, and output the clock after the adjustment of the phase, as a blunt clock BLUNT, to the logical negation circuit INV2. Further, the phase adjustment circuit 111 may include a constituent element for forcibly transiting the state of the signal when a certain time lapses for each cycle, in order to prevent a waveform deformation from occurring when the next cycle of the input clock IN(x) comes before the electric potential of the blunt clock BLUNT reaches the threshold voltage of the logical negation circuit INV2, by the voltage in accordance with the comparison signal COMP_O. Such a phase adjustment circuit 111 may be configured to include a logical negation circuit INV1, the current sources I1 and I2, a delay circuit 1111, switches SW1 and SW2, and a current controller 1112, for example.

The logical negation circuit INV1 may be an inverter circuit, for example. The logical negation circuit INV1 may adjust the phase of the input clock IN(x), in accordance with the switches SW1 and SW2 and the current sources I1 and I2, and output the clock after the adjustment of the phase, as the blunt clock BLUNT, to the logical negation circuit INV2. Specifically, the logical negation circuit INV1 may adjust the phase of the input clock IN(x) input to the input terminal i1 of the skew adjustment circuit 11(x), in accordance with the switches SW1 and SW2, in each of which the on/off is controlled by the delay circuit 1111, and the current sources I1 and I2, in each of which the current value is controlled by the current controller 1112, and output the clock after the adjustment of the phase, as the blunt clock BLUNT, to the logical negation circuit INV2. In the example, in the logical negation circuit INV1, the input terminal may be connected with the input terminal i1 of the skew adjustment circuit 11(x), the output terminal may be connected with an input terminal of the logical negation circuit INV2, the power terminal may be connected with one terminal of the switch SW1 and one terminal of the current source I1, and the grounding terminal may be connected with one terminal of the switch SW2 and one terminal of the current source I2.

The current source I1 may be, for example, a current mirror circuit. The current source I1 may adjust the current value in accordance with a phase control signal DBIT output from the current controller 1112, and supply the current after the adjustment of the current value to the power terminal of the logical negation circuit INV1. By this, the current source I1 may control the rise time of the blunt clock BLUNT, in accordance with the voltage value controlled by the current controller 1112. In this example, in the current source I1, one terminal may be connected with the power terminal of the logical negation circuit INV1 and one terminal of the switch SW1, and the other terminal may be connected with a power line VDD.

The current source I2 may be, for example, a current mirror circuit. The current source I2 may adjust a current value in accordance with the phase control signal DBIT output from the current controller 1112, lead out the current after the adjustment of the current value, from the grounding terminal of the logical negation circuit INV1, and supply the led current to the grounding line GND. By this, the current source I2 may control the fall time of the blunt clock BLUNT, in accordance with the voltage value controlled by the current controller 1112. In this example, in the current source I2, one terminal may be connected with the grounding terminal of the logical negation circuit INV1 and one terminal of the switch SW2, and the other terminal may be connected with the grounding line GND.

The delay circuit 1111 may be, for example, a delay buffer, a D-type flip-flop or a delay controller (DLL: Delay Locked Loop). The delay circuit 1111 may add a predetermined delay time to the input clock IN(x), and output the clock after the addition of the predetermined delay time, to control terminals of the switches SW1 and SW2. The predetermined delay time may be about one-third time of the cycle of the input clock IN(x), for example, but without being limited to this, may be an arbitrary time, if the time is shorter than at least the cycle of the input clock IN(x) and is long enough not to inhibit the normal blunting of the waveform of the blunt clock BLUNT by the current sources I1 and I2, in order to prevent the above-described waveform deformation of the input clock IN(x).

The switch SW1 may be, for example, a MOS transistor. The switch SW1 may control the on/off of the supply of the current to the power terminal of the logical negation circuit INV1, in accordance with the delayed input clock IN(x) output from the delay circuit 1111. Specifically, the on/off may be controlled in accordance with the delayed clock IN(x) output from the delay circuit 1111, and thereby, the switch SW1 may control the on/off of the supply of the current from the power line VDD to the power terminal of the logical negation circuit INV1. In this example, in the switch SW1, one terminal may be connected with the power terminal of the logical negation circuit INV1 and one terminal of the current source I1, the other terminal may be connected with the power line VDD, and the control terminal may be connected with an output terminal of the delay circuit 1111 and the control terminal of the switch SW2.

The switch SW2 may be, for example, a MOS transistor. The switch SW2 may control the on/off of the leading-out of the current from the grounding terminal of the logical negation circuit INV1, in accordance with the delayed input clock IN(x) output from the delay circuit 1111. Specifically, the on/off may be controlled in accordance with the delayed clock IN(x) output from the delay circuit 1111, and thereby, the switch SW2 may control the on/off of the leading-out of the current from the power terminal of the logical negation circuit INV1 to the grounding line GND. In this example, in the switch SW2, one terminal may be connected with the grounding terminal of the logical negation circuit INV1 and one terminal of the current source I2, the other terminal may be connected with the grounding terminal GND, and the control terminal may be connected with the output terminal of the delay circuit 1111 and the control terminal of the switch SW1.

The delay circuit 1111 and the switches SW1 and SW2, as described above, may be provided in the phase adjustment circuit 111, for forcibly transiting the state of the signal when a certain time lapses for each cycle, in order to prevent the waveform deformation from occurring when the next cycle of the input clock IN(x) comes before the electric potential of the blunt clock BLUNT reaches the threshold voltage of the logical negation circuit INV2, by the blunting in accordance with the phase control signal DBIT.

The current controller 1112 may generate a phase control signal DBIT, which is a digital signal, in accordance with the control signal CNT output from the controller 20, and control the current value of the current generated by the current sources I1 and I2. Specifically, when the control signal CNT indicates the skew adjustment mode, the current controller 1112 may determine the electric potential of the comparison signal COMP_O output from the comparator COMP. For example, in the case of determining that the electric potential of the comparison signal COMP_O is "H," the current controller 1112 may raise a state of the phase control signal DBIT by a predetermined value ΔI (e.g., 1 LSB), and output the signal to the current sources I1 and I2. On the other hand, for example, in the case of determining that the electric potential of the comparison signal COMP_O is "L," the current controller 1112 may store the state of the phase control signal DBIT in an internal register (not illustrated), and output the signal to the current sources I1 and I2. As described above, the phase adjustment circuit 111 may adjust the phase of the input clock IN(x), in accordance with the current value of the current generated by the current sources I1 and I2, and therefore, the current controller 1112 may function as a phase adjustment amount controller that controls the current value generated by the current sources I1 and I2 and thereby controls the amount of the phase adjusted by the phase adjustment circuit 111. In this example, in the case of determining that the electric potential of the comparison signal COMP_O is "H," the current controller 1112 raises the state of the phase control signal DBIT by the predetermined value ΔI, but without being limited to this, the state of the phase control signal DBIT may be lowered by the predetermined value ΔI.

Further, when the control signal CNT indicates the normal operation mode, the current controller 1112 may generate the phase control signal DBIT having the result of the calibration stored in the skew adjustment mode, and output the signal to the current sources I1 and I2. Further, when the control signal CNT indicates the self-calibration mode, the current controller 1112 may stop the operation.

The phase adjustment circuit 111 configured as described above may adjust the phase of the input clock IN(x), in accordance with the comparison signal COMP output from the skew detector 112, and output the clock to the logical negation circuit INV2, as the blunt clock BLUNT. By this, the phase adjustment circuit 111 may adjust the phase of the input clock IN(x), in accordance with the comparison signal COMP output by the skew detector 112. Further, the phase adjustment circuit 111 may control, by the delay circuit 1111, the on/off for the shorted between the power terminal of the logical negation circuit INV1 and the power line VDD and the shorted between the grounding terminal and the grounding line GND, and thereby, can prevent the waveform deformation from occurring when the next cycle of the input clock IN(x) comes before the electric potential of the blunt clock BLUNT reaches the threshold voltage of the logical negation circuit INV2.

The capacitance element C1 may be, for example, a MOM capacitor. The capacitance element C1 may add the blunting in accordance with the capacitance value, to the blunt clock BLUNT output from the phase adjustment circuit 111, and output the blunt clock BLUNT after the addition of the blunting, to the logical negation circuit INV2. In the capacitance element C1, one terminal may be connected with the phase adjustment circuit 111 and the input terminal of the logical negation circuit INV2, and the other terminal may be connected with the grounding line GND.

The logical negation circuit INV2 may be an inverter circuit, for example. The logical negation circuit INV2 may perform the logical negation for the blunt clock BLUNT output from the phase adjustment circuit 111, may output the result of the logical negation as the output clock OUT(x), and may output the clock to one terminal of one side of an interlock switch SW3 of the skew detector 112, as well as to the input terminal i2 (not illustrated) of the skew adjustment circuit 11(x−1) and the exterior through the output terminal o.

The skew detector 112 may control itself to set one of the normal operation mode, the self-calibration mode and the skew adjustment mode, in accordance with the control signal CNT output from the controller 20, and then operate in accordance with the mode. Specifically, in the self-calibration mode, the skew detector 112 may calibrate the property variation thereof, and store the result of the calibration in the voltage controller 1122. In the skew adjustment mode, the skew detector 112 may detect the skew between the clocks input to the two input terminals, in accordance with the stored calibration result, and output the detected skew to the current controller 1112, as the comparison signal COMP_O. In the normal operation mode, the skew detector 112 may stop the operation. The skew detector 112 may be configured to include interlock switches SW3 and SW4, a logical product circuit AND, a low-pass filter (LPF) 1121, the comparator COMP, the voltage controller 1122, a voltage generator 1123, and a switch SW5, for example.

The interlock switch SW3 may be, for example, a MOS transistor. In the interlock switch SW3, the on/off may be controlled in accordance with the control signal CNT output from the controller 20. Specifically, when the control signal CNT indicates either the self-calibration mode or the normal operation mode, the interlock switch SW3 may be controlled so as to be turned off. Further, when the control signal CNT indicates the skew adjustment mode, the interlock switch SW3 may be controlled so as to be turned on. In this example, in the interlock switch SW3, one end of one input terminal may be connected with the output terminal of the logical negation circuit INV2 and the output terminal o, the other end of the one input terminal may be connected with one input terminal of the logical product circuit AND and the other end of one input terminal of the interlock switch SW4, one end of the other input terminal may be connected with the input terminal i2, the other end of the other input terminal may be connected with the other input terminal of the logical product circuit AND and the other end of the other input terminal of the interlock switch SW4, and the control terminal may be connected with a control terminal ct.

The interlock switch SW4 may be, for example, a MOS transistor. In the interlock switch SW4, the on/off may be controlled in accordance with the control signal CNT output from the controller 20. Specifically, when the control signal CNT indicates the self-calibration mode, the interlock switch SW4 may be controlled so as to be turned on. Further, when the control signal CNT indicates either the skew adjustment mode or the normal operation mode, the interlock switch SW4 may be controlled so as to be turned off. In this example, in the interlock switch SW4, one end of one input terminal may be connected with the input terminal i1 and one end of the other terminal of the interlock switch SW4 itself, the other end of the one input terminal may be connected with one input terminal of the logical product circuit AND and the other end of one input terminal of the interlock switch SW3, one end of the other input terminal may be connected with the input terminal i1 and one end of one input terminal of the interlock switch SW4 itself, the other end of the other input terminal may be connected with the other input terminal of the logical product circuit AND and the other end of the other input terminal of the interlock switch SW3, and the control terminal may be connected with the control terminal ct.

The logical product circuit AND may be, for example, an AND gate. The logical product circuit AND may perform the logical product for the clocks input to two input terminals of itself, and output the result of the logical product to the low-pass filter 1121, as a phase difference signal DIF_PH. Specifically, the logical product circuit AND may perform the logical product for the clocks input from the interlock switch SW3 or SW4 to the two input terminals, to detect the skew between the two clocks, and output the result of the logical product (that is, the detected skew) to the low-pass filter 1121, as the phase difference signal DIF_PH.

The low-pass filter 1121 may remove high frequency band from the phase difference signal DIF_PH output from the logical product circuit AND, and output it to a non-inverting terminal "+" of the comparator COMP, as input, as an analog DC voltage signal Z. Specifically, the low-pass filter 1121 may perform an integration operation for the phase difference signal DIF_PH indicating the skew between the two clocks output from the logical product circuit AND, smooth the waveform of the signal by removing high frequency band, and output it to the non-inverting terminal "+" of the comparator COMP, as the analog DC voltage signal Z. That is, in this embodiment, the low-pass filter 1121 may function as an integration circuit.

The comparator COMP may be, for example, a comparator. The comparator COMP may compare the electric potential of the analog DC voltage signal Z output from the low-pass filter 1121 and the electric potential of a reference voltage signal VREF output from the voltage generator 1123, determine which of the electric potentials of the signals is greater, and output the determination result as the comparison signal COMP_O. Specifically, the comparator COMP may compare the electric potential of the analog DC voltage signal Z output from the low-pass filter 1121 to the non-inverting terminal "+" and the electric potential of the reference voltage signal VREF output from the voltage generator 1123 to an inverting terminal "−," and determine which of the electric potentials of the signals is greater, and output the determination result, as the comparison signal COMP_O, to one terminal of the switch SW5 and the voltage controller 1122.

The voltage controller 1122, in accordance with the control signal CNT output from the controller 20, may generate a voltage control signal RBIT that is a digital signal, and control the electric potential of the reference voltage signal VREF that is output by the voltage generator 1123. Specifically, when the control signal CNT indicates the self-calibration mode, the voltage controller 1122 may determine the electric potential of the comparison signal COMP_O output from the comparator COMP. For example, in a case of determining that the electric potential of the comparison signal COMP_O is "H" (i.e., the electric potential of the power line VDD), the voltage controller 1122 may raise the state of the voltage control signal RBIT by a predetermined value Δv (e.g., 1 LSB: Least Significant Bit), and may output the signal to the voltage generator 1123. On the other hand, for example, in a case of determining that the electric potential of the comparison signal COMP_O is "L" (i.e., the electric potential of the grounding line GND), the voltage controller 1122 may store the state of the voltage control signal RBIT in an internal resister (not illustrated), and output the signal to the voltage generator 1123. In the example, in a case of determining that the electric potential of the comparison signal COMP_O is "H," the voltage controller 1122 may raise the state of the voltage control signal RBIT by the predetermined value Δv, but without being limited to this, the state of the voltage control signal RBIT may be lowered by the predetermined value Δv.

Further, when the control signal CNT indicates the skew adjustment mode, the voltage controller 1122 may generate the voltage control signal RBIT indicating the result of the calibration stored in the self-calibration mode, and output the signal to the voltage generator 1123. Further, when the control signal indicates the normal operation mode, the voltage controller 1122 may stop the operation.

The voltage generator 1123 may generate the reference voltage signal VREF, in accordance with the voltage control signal RBIT output from the voltage controller 1122 and the control signal CNT output from the controller 20, and output the signal to the inverting terminal "−" of the comparator COMP. Specifically, when the control signal CNT indicates the self-calibration mode, the voltage generator 1123 may output, as the reference voltage signal VREF, the electric potential in accordance with the voltage control signal RBIT output from the voltage controller 1122, on the basis of one-half of the electric potential of the power line VDD, and output the signal to the inverting terminal "−" of the comparator COMP. When the control signal CNT indicates the skew adjustment mode or the normal operation mode, the voltage generator 1123 may output, as the reference voltage signal VREF, the electric potential in accordance with the voltage control signal RBIT output from the voltage controller 1122, on the basis of one-fourth of the electric potential of the power line VDD, and output the signal to the inverting terminal "−" of the comparator COMP.

The switch SW5 may be, for example, a MOS transistor. In the switch SW5, the on/off may be controlled in accordance with the control signal CNT output from the controller 20. Specifically, when the control signal CNT indicates the self-calibration mode or the normal operation mode, the switch SW5 may be controlled so as to be turned off. Further, when the control signal CNT indicates the skew adjustment mode, the switch SW5 may be controlled so as to be turned on. In this example, in the switch SW5, one end of the input terminals may be connected with the output terminal of the comparator COMP and the voltage controller 1122, the other end of the input terminals may be connected with the current controller 1112, and further the control terminal may be connected with the control terminal ct.

In the self-calibration mode, the skew detector 112 configured as described above may calibrate the property variation of itself, and store the result of the calibration in the voltage controller 1122. Further, in the skew adjustment mode, the skew detector 112 may detect, with the logical product circuit AND, the skew between the clocks input to the two input terminals, in accordance with the result of the calibration stored in the self-calibration mode, and output the result of the detection to the current controller 1112. Further, in the normal operation mode, the skew detector 112 may stop the operation. Therefore, by calibrating the property variation of itself and detecting the skew between the two clocks with the logical product circuit AND, the skew detector 112 can detect, with high accuracy, the skew between the multiphase clocks in a semiconductor integrated circuit that operates at a very high speed (e.g., 5 GHz).

In the self-calibration mode, the skew adjustment circuit 11($x$) configured as described above may calibrate the property variation of the skew detector 112, under the control by the controller 20. Next, in the skew adjustment mode, the skew adjustment circuit 11($x$) may detect, with the logical product circuit AND, the skew between the input clock IN($x$) and the output clock OUT($x$+1), in accordance with the result of the calibration of the skew detector 112 stored in the self-calibration mode, and, with the current controller 1112, reflect the detected result in the current value of the current that is supplied by the current sources I1 and I2 of the phase adjustment circuit 111. The skew adjustment circuit 11($x$) may repeat such control in the skew adjustment mode, until the skew between the two clocks becomes a desired skew, and store, in the current controller 1112, the current value when it becomes the desired skew. Finally, in the normal operation mode, the skew adjustment circuit 11($x$) may adjust the current of the current sources I1 and I2 of the phase adjustment circuit 111, in accordance with the current value stored in the skew adjustment mode, and thereby, adjust the phase of the input clock IN($x$). By way of this, the skew between the input clock IN($x$) and the output clock OUT($x$+1) is adjusted.

The skew adjustment circuit 11($x$) described above may calibrate the property variation of itself in the self-calibration mode, and detect, with the logical product circuit AND, the skew between the two clocks in the skew adjustment mode. By this, in the normal operation mode, it is possible to adjust, with high accuracy, the skew between the multiphase clocks in the semiconductor integrated circuit that operates at a very high speed (for example, 5 GHz).

Figure 3A:
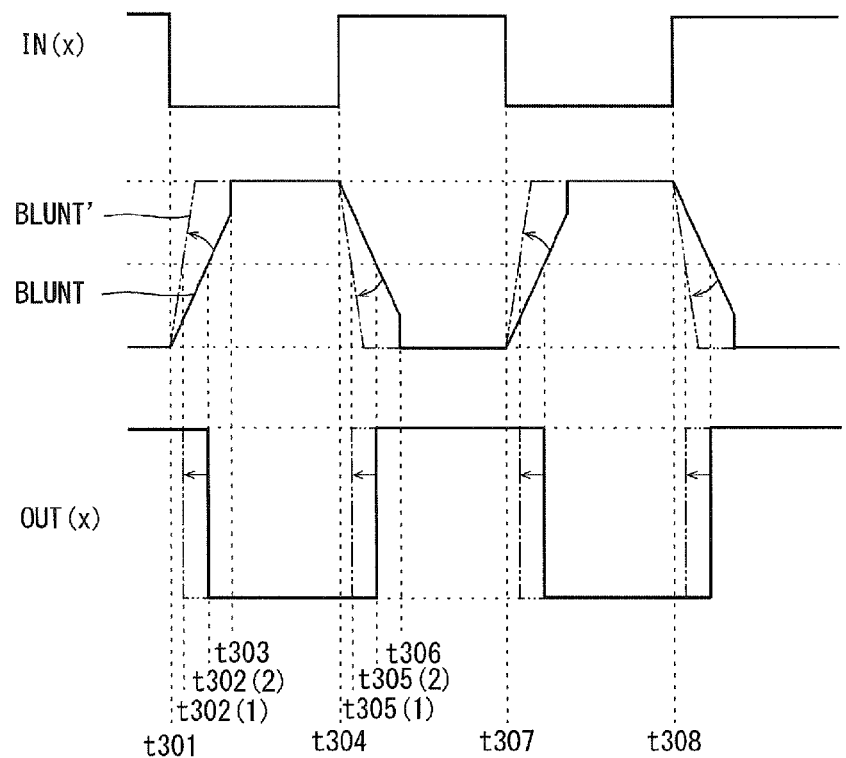
FIGS. 3A and 3B is a timing chart for showing a calibration of a blunt clock in a skew adjustment circuit according to an embodiment of the present invention.
Figure 3B:
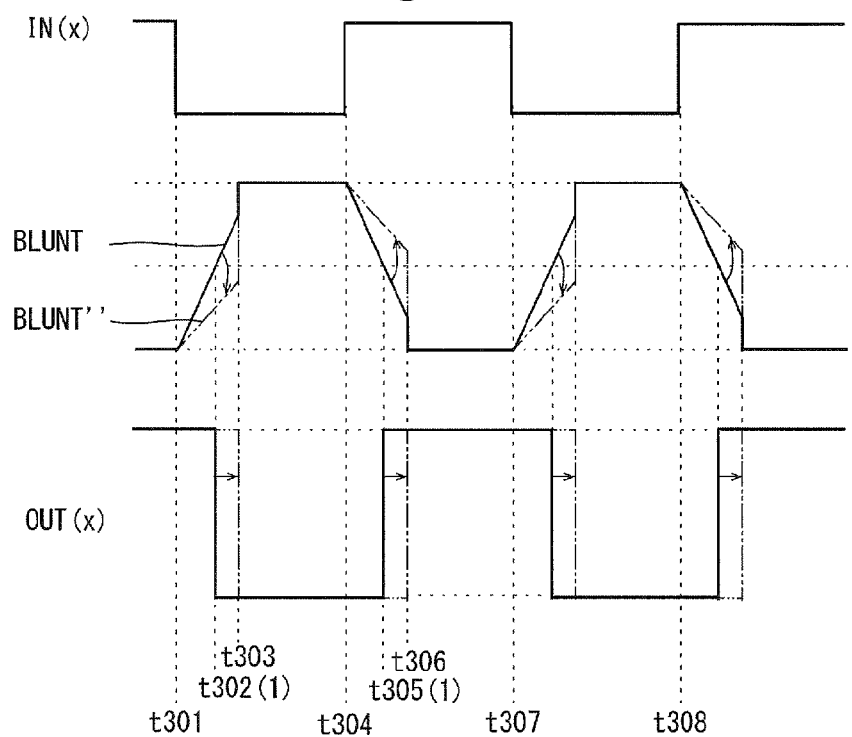

FIGS. 3A and 3B is a timing chart for showing a calibration of a blunt clock in a skew adjustment circuit according to an embodiment of the present invention. Specifically, FIG. 3A shows a timing chart of the clocks when the skew adjustment circuit 11 calibrates the blunting of the blunt clock BLUNT such that it is steep. Further, FIG. 3B shows a timing chart of the clocks when the skew adjustment circuit 11 calibrates the blunting of the blunt clock BLUNT such that it is gentle.

In FIG. 3A, the timings when the input clock IN($x$) alternates are defined as times t301, t304, t307 and t308, respectively. Further, a blunt clock after the blunting of the blunt clock BLUNT becomes steep by the current sources I1 and I2 in accordance with the control by the current controller 1112 is shown as a blunt clock BLUNT'. Further, in this embodiment, the threshold voltage of the logical negation circuit INV2 is one-half of the electric potential of "H." Further, the times when the blunt clocks BLUNT and BLUNT' reach the threshold voltage (that is, one-half of the electric potential of "H") of the logical negation circuit INV2 from the electric potential "L" are defined as times t302(2) and t302(1) respectively, the times when the blunt clocks BLUNT and BLUNT' reach the threshold voltage of the logical negation circuit INV2 from the electric potential "H" are defined as times t305(2) and t305(1) respectively, and the times when the delay circuit 1111 turns the switches SW1 and SW2 on after the reaching of the input clock IN are defined as times t303 and t306, respectively.

When the current values of the current sources I1 and I2 are controlled to, for example, reference current values by the control from the current controller 1112, the currents of the power side and the grounding side may have the reference current values, and therefore, the logical negation circuit INV1 may add a predetermined blunting to the input clock IN in accordance with the current values, and output the clock as the blunt clock BLUNT. By this, when the input clock IN(x) alternates (time t301), the logical negation circuit INV1 may transit the electric potential of the blunt clock BLUNT from "L" to "H." Further, at the time t301, the electric potential of the output clock OUT(x) that the logical negation circuit INV2 outputs may be "H." The electric potential of the blunt clock BLUNT, which starts to transit from "L" to "H" at the time t301 due to the logical negation circuit INV1, may reach the threshold voltage of the logical negation circuit INV2 at the time t302(2), and therefore, the logical negation circuit INV2 may transit the electric potential of the output clock OUT(x) from "H" to "L" at the time t302(2). At the time t303, although the electric potential of the blunt clock BLUNT does not reach "H," the switch SW1 may be turned on by the control from the delay circuit 1111, and thereby, the electric potential of the blunt clock BLUNT may be forced to be "H."

Further, when the input clock IN(x) alternates (time t304), the logical negation circuit INV1 may transit the electric potential of the blunt clock BLUNT from "H" to "L." The electric potential of the blunt clock BLUNT, which starts to transit from "H" to "L" at the time t304 due to the logical negation circuit INV1, may reach the threshold voltage of the logical negation circuit INV2 at the time t305(2), and therefore, the logical negation circuit INV2 may transit the electric potential of the output clock OUT(x) from "L" to "H" at the time t305(2). At the time t306, although the electric potential of the blunt clock BLUNT does not reach "L," the switch SW2 may be turned on by the control from the delay circuit 1111, and thereby, the electric potential of the blunt clock BLUNT may be forced to be "L" at the time t306.

When the current values of the current sources I1 and I2 are controlled so as to be greater than the reference current values by the control from the current controller 1112, the currents of the power side and the grounding side may have current values greater than the reference current values, and therefore, the logical negation circuit INV1 may perform the logical negation for the input clock IN(x), and generate the blunt clock BLUNT' in which a steeper blunting than the blunting as the reference has been added to the clock. By this, when the input clock IN(x) alternates (time t301), the logical negation circuit INV1 may transit the electric potential of the blunt clock BLUNT' from "L" to "H." As shown in FIG. 3A, at the time t301, the electric potential of the output clock OUT(x) that the logical negation circuit INV2 outputs is "H." The electric potential of the blunt clock BLUNT', which starts to transit from "L" to "H" at the time t301 due to the logical negation circuit INV1, may reach the threshold voltage of the logical negation circuit INV2 at the time t302(1), and therefore, the logical negation circuit INV2 may transit the electric potential of the output clock OUT(x) from "H" to "L" at the time t302(1). Then, the logical negation circuit INV1 may transit the electric potential of the clock to "H," before the SW1 is turned on at the time t303.

Further, when the input clock IN(x) alternates (time t304), the logical negation circuit INV1 may transit the electric potential of the blunt clock BLUNT' from "H" to "L." The electric potential of the blunt clock BLUNT', which starts to transit from "H" to "L" at the time t304 due to the logical negation circuit INV1, may reach the threshold voltage of the logical negation circuit INV2 at the time t305(1), and therefore, the logical negation circuit INV2 may transit the electric potential of the output clock OUT(x) from "L" to "H" at the time t305(1). Then, the logical negation circuit INV1 transits the electric potential of the clock to "L," before the time t306.

Thus, in a case where the current values of the current sources I1 and I2 are controlled by the control from the current controller 1112 such that the blunting of the blunt clock BLUNT is steep, the logical negation circuit INV1 of the phase adjustment circuit 111 may output the output clock OUT(x) having an advanced phase (the two-dot chain line in FIG. 3A) compared to the case where the blunting of the blunt clock BLUNT is not steep (the solid line in FIG. 3A).

Next, a case where the skew adjustment circuit 11 calibrates the blunting of the blunt clock BLUNT such that it is gentle will be described with reference to FIG. 3B. Further, a blunt clock after the blunting of the blunt clock BLUNT becomes gentle by the current sources I1 and I2 in accordance with the control by the current controller 1112 is shown as a blunt clock BLUNT". Further, the times t301 to t308 are the same as those described in FIG. 3A. Further, the transition of the state of the blunt clock BLUNT in FIG. 3B has been described in FIG. 3A, and therefore, the description is omitted.

When the current values of the current sources I1 and I2 are controlled to current values smaller than the reference current values by the control from the current controller 1112, the currents of the power side and the grounding side may have current values smaller than the reference current values, and therefore, the logical negation circuit INV1 may perform the logical negation for the input clock IN(x), and generate the blunt clock BLUNT" in which a gentle blunting has been added to the clock. By this, when the input clock IN(x) alternates (time t301), the logical negation circuit INV1 gently may transit the electric potential of the blunt clock BLUNT" from "L" to "H." Further, at the time t301, the electric potential of the output clock OUT(x) that the logical negation circuit INV2 outputs is "H." Although the electric potential of the blunt clock BLUNT" still may not reach the threshold voltage of the logical negation circuit INV2 at the time t303, the switch SW1 may turned on by the control from the delay circuit 1111 at the time t303, and thereby, the electric potential of the blunt clock BLUNT" may be forced to be "H" at the time t303. At the time t303, the logical negation circuit INV2 may transit the electric potential of the output clock OUT(x) from "H" to "L," in accordance with the electric potential "H" of the blunt clock BLUNT."

Further, when the input clock IN(x) alternates (time t304), the logical negation circuit INV1 may gently transit the electric potential of the blunt clock BLUNT" from "H" to "L." Although the electric potential of the blunt clock BLUNT" still may not reach the threshold voltage of the logical negation circuit INV2 at the time t306, the switch SW2 may be turned on at the time t306 by the control from the delay circuit 1111, and thereby, the electric potential of the blunt clock BLUNT" may be forced to be "L" at the time t306. Further, the logical negation circuit INV2 may transit the electric potential of the output clock OUT(x) from "L" to "H," in accordance with the electric potential "L" of the blunt clock BLUNT." It is noted that the electric potentials of the blunt clocks BLUNT, BLUNT' and BLUNT" may start to transit at the times t307 and t308, similarly to the time t301 and the time t304.

In a case where the current values of the current sources I1 and I2 are controlled by the control from the current controller 1112 such that the blunting of the blunt clock BLUNT is gentle, the logical negation circuit INV2 of the phase adjustment circuit 111 may output the output clock OUT(x) having a delayed phase compared to the case where the blunting of the blunt clock BLUNT is not gentle.

As described above, the phase adjustment circuit 111 may output the output clock OUT(x) in which the phase has been adjusted in accordance with the control by the current controller 1112. Further, it is found that, in a case where the blunting added by the current sources I1 and I2 is gentle, the phase adjustment circuit 111 forcibly may transit the electric potential of the blunt clock BLUNT at a predetermined time after the reaching of the input clock IN(x), in order to prevent the waveform deformation from occurring when the next cycle of the input clock IN(x) comes before the electric potential of the blunt clock BLUNT reaches the threshold electric potential.

Figure 4:
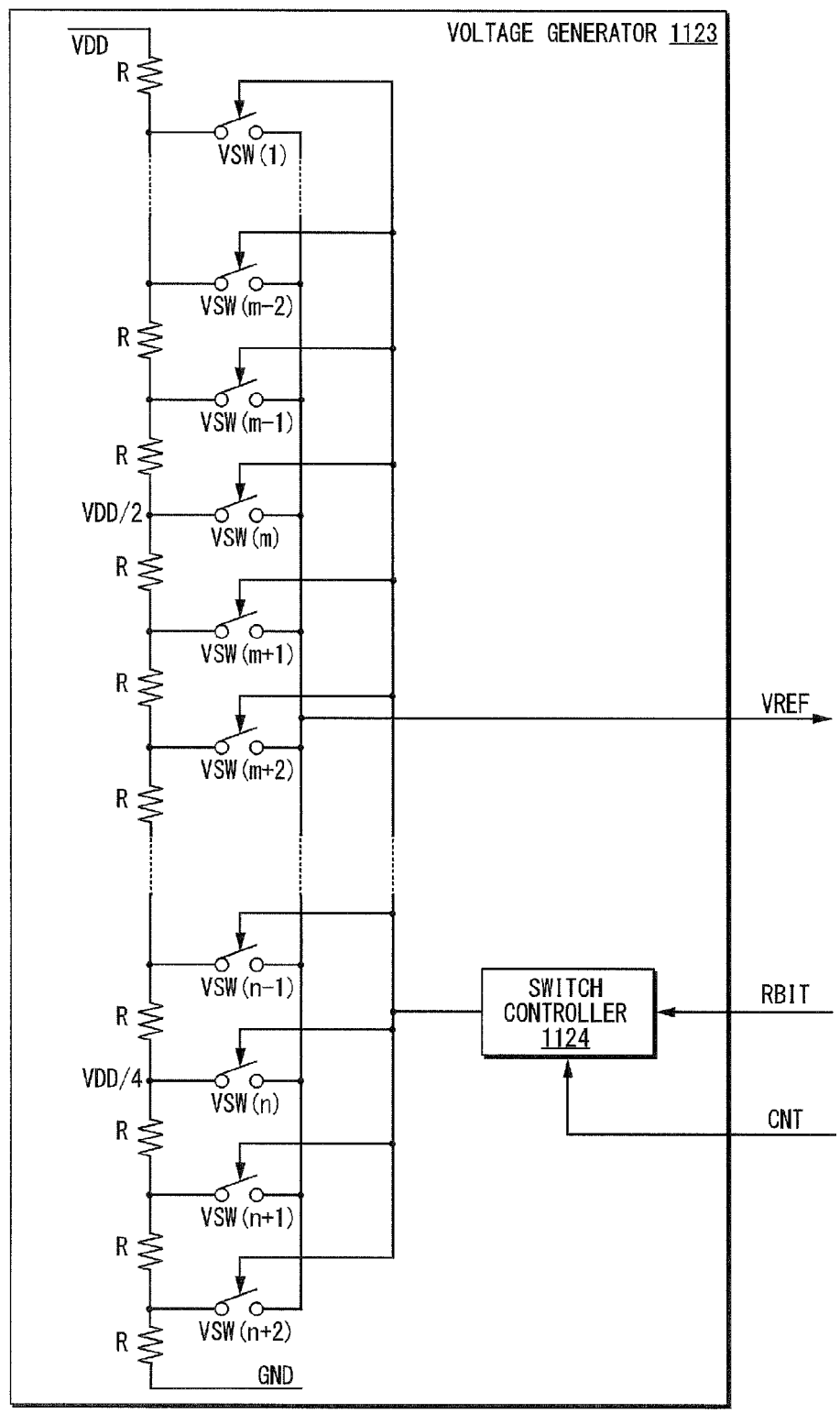
FIG. 4 is a diagram showing an example of a voltage generator according to an embodiment of the present invention.

FIG. 4 is a diagram showing an example of a voltage generator according to an embodiment of the present invention. As shown in FIG. 4, the voltage generator 1123 according to this embodiment may be configured to include multiple resistors R, multiple switches VSW(1) to VSW(n+2) (here, n is a value indicating a switch VSW that outputs one-fourth of the electric potential of the power line VDD), and a switch controller 1124. As described above, the voltage generator 1123 may generate the reference voltage signal VREF in accordance with the control signal CNT output from the controller 20 and the voltage control signal RBIT output from the voltage controller 1122, and output the signal to the inverting terminal "−" of the comparator COMP.

The multiple resistors R may be, for example, polysilicon resistors or diffusion resistors and constitute a ladder resistor by being connected in series with each other. In this example, in the ladder resistor, one terminal may be connected with the power line VDD, the other terminal may be connected with the grounding line GND, and one terminals of the switches VSW(1) to VSW(n+2) may be connected with nodes that connect the resistors R with each other, respectively. The ladder resistor may voltage-divide the electric potential of the power line VDD by the resistor R, and thereby, output electric potentials corresponding to the voltage division ratio, from the nodes to the switches VSW(1) to VSW(n+2), respectively.

The multiple switches VSW may be, for example, MOS transistors and the on/off may be controlled by the control from the switch controller 1124. In this example, in each of the multiple switches VSW, one terminal may be connected with the node that connects the resistors R of the ladder resistor with each other, the other terminal may be connected with the inverting terminal "−" of the comparator COMP, and the control terminal may be connected with the switch controller 1124.

The switch controller 1124 may turn one switch of the multiple switches VSW on and turn the other switches off, in accordance with the control signal CNT output from the controller 20 and the voltage control signal RBIT output from the voltage controller 1122. Specifically, when the control signal CNT output from the controller 20 indicates the self-calibration mode, the switch controller 1124 may turn on one switch VSW of switches VSW(m−α) to VSW(m+α) that correspond to the voltage control signal RBIT output from the voltage controller 1122, and turn the other switches VSW off, on the basis of one-half of the electric potential of the power line VDD (that is, the node at VDD/2 in the figure). Here, m is a value indicating a switch VSW that outputs one-half of the electric potential of the power line VDD, and a is a positive integer. On the other hand, when the control signal CNT output from the controller 20 indicates the normal operation mode or the skew adjustment mode, the switch controller 1124 may turn on one switch of switches VSW(n−α/2) to VSW(n+α/2) that correspond to the voltage control signal RBIT output from the voltage controller 1122, and turn the other switches VSW off, on the basis of one-fourth of the electric potential of the power line VDD (the node at VDD/4 in the figure).

The voltage generator 1123 configured as described above may generate the reference voltage signal VREF in accordance with the control signal CNT and the voltage control signal RBIT, and output the signal to the inverting terminal "−" of the comparator COMP.

[Description of Operation in Self-Calibration Mode]

Figure 5:
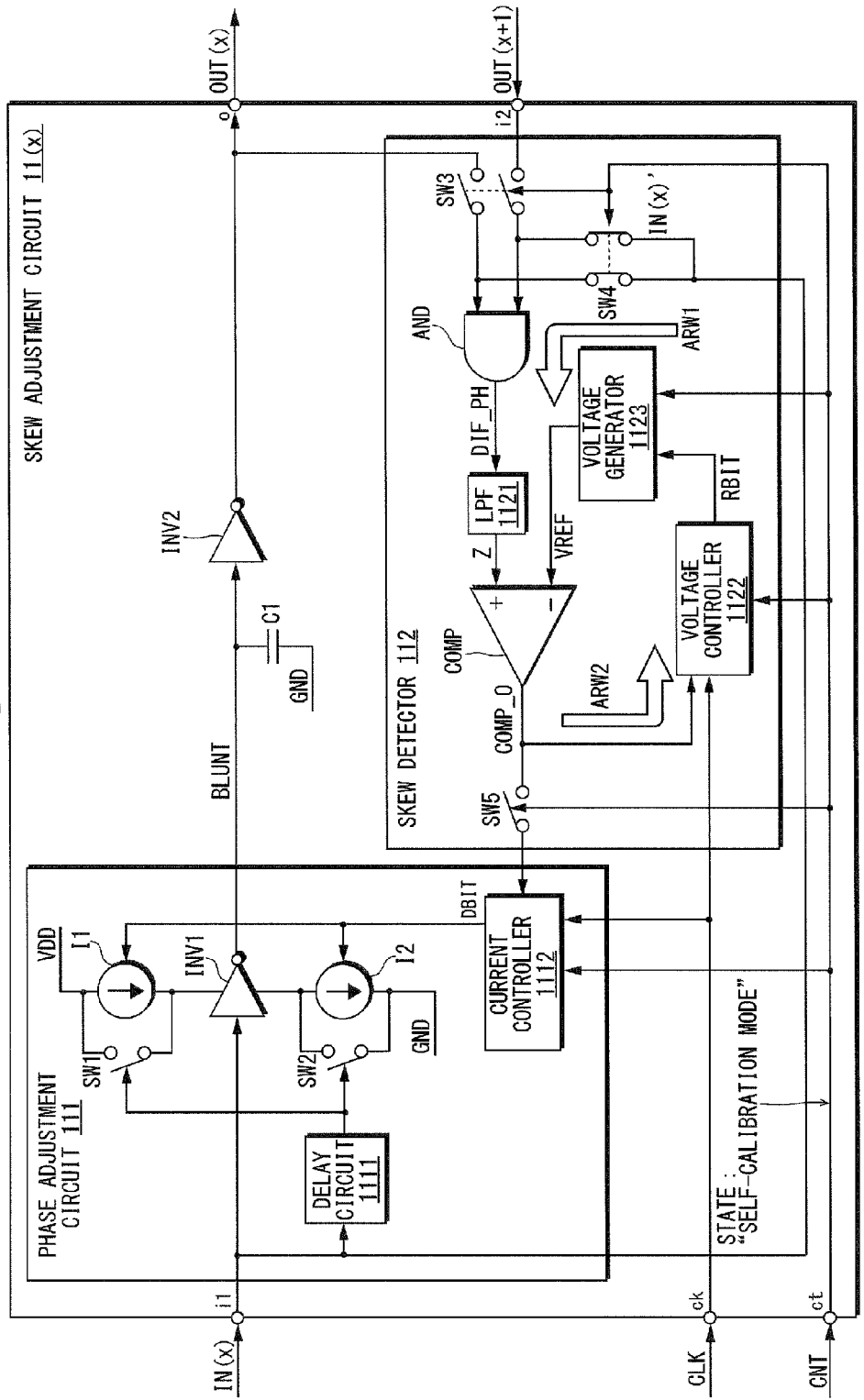
FIG. 5 is a diagram showing an example of operation in a self-calibration mode of a skew adjustment circuit according to an embodiment of the present invention.

FIG. 5 is a diagram showing an example of the operation in a self-calibration mode of a skew adjustment circuit according to an embodiment of the present invention. As shown in FIG. 5, the controller 20 may generate the control signal CNT indicating a state being the self-calibration mode, and output it to the skew detector 112 and the current controller 1112.

The interlock switches SW3 and SW4 may turn the states "off" and "on," respectively, in accordance with the state "self-calibration mode" of the control signal CNT. By this, the input clocks IN(x) and IN(x)' may be input to the two input terminals of the logical product circuit AND, through a pair of the interlock switches SW4, respectively.

The logical product circuit AND may perform the logical product for a pair of the input clocks IN(x) and IN(x)', and output the result of the logical product to the low-pass filter 1121, as the phase difference signal DIF_PH. Since the pair of the input clocks IN(x) and IN(x)' are roughly the same signal, the logical product circuit AND may output the input clock IN(x) to the low-pass filter 1121, as the phase difference signal DIF_PH.

The low-pass filter 1121 may remove high frequency band from the phase difference signal DIF_PH output from the logical product circuit AND, and output it to the non-inverting terminal "+" of the comparator COMP, as the analog DC voltage signal Z. Since the logical product circuit AND outputs the input clock IN(x) as the phase difference signal DIF_PH, the low-pass filter 1121 may output about one-half of the electric potential of the "H," as the analog DC voltage signal Z, to the non-inverting terminal "+" of the comparator COMP, when the duty ratio of the input clock IN(x) is 50%, for example.

The comparator COMP may compare the electric potential of the analog DC voltage signal Z output from the low-pass filter 1121 and the electric potential of the reference voltage signal VREF output from the voltage generator 1123, and output the comparison result to the voltage controller 1122, as the comparison signal COMP_O (an arrow ARW2 in FIG. 4). It is noted that the state of the switch SW5 may be turned off, in accordance with the state "self-calibration mode" of the control signal CNT.

The voltage controller 1122 may determine the state of the comparison signal COMP_O output from the comparator COMP, in accordance with the state "self-calibration mode" indicated by the control signal CNT. In a case of determining that the state of the comparison signal COMP_O is "H," the voltage controller 1122 may raise the state of the voltage control signal RBIT by 1 LSB, output the signal to the voltage generator 1123, and set the state of a calibration completion signal CAL_DONE (not illustrated), which is an internal signal, to "L." Then, in accordance with the state "self-calibration mode" of the control signal CNT, the voltage generator 1123 may generate the reference voltage signal VREF in accordance with the state of the voltage control signal RBIT output from the voltage controller 1122, on the basis of one-half of the electric potential of the power line VDD, and output the signal to the inverting terminal "−" of the comparator COMP (an arrow ARW1 in the figure).

The voltage controller 1122 and the voltage generator 1123 may execute such operation repeatedly until the state of the comparison signal COMP_O becomes "L." That is, the signals of the skew adjustment circuit 11(x) in the self-calibration mode may pass through paths shown by the arrows ARW1 and ARW2. In a case of determining that the state of the comparison signal COMP_O is "L," the voltage controller 1122 may store the state of the voltage control signal RBIT in the internal resister, and transit the state of the calibration completion signal CAL_DONE, which is an internal signal, from "L" to "H." Then, the voltage generator 1123 may stop the operation, and the skew adjustment circuit 11 may terminate the operation in the self-calibration mode.

Figure 6:
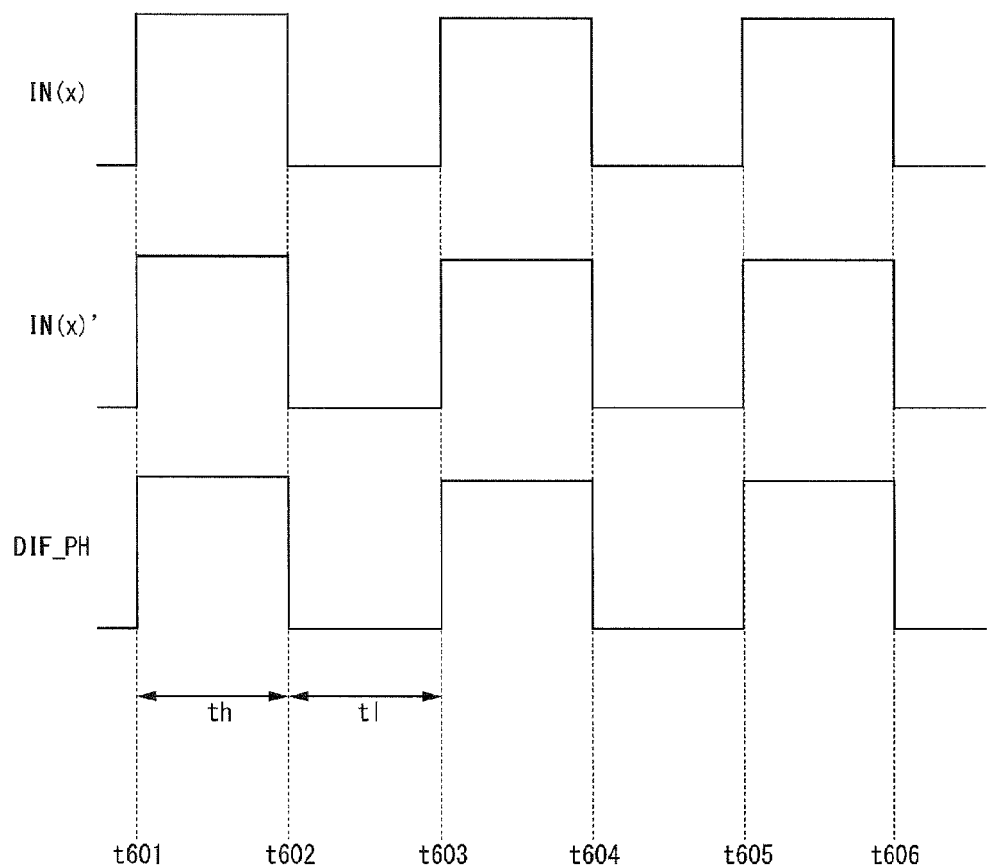
FIG. 6 is a timing chart in a self-calibration mode of input and output signals of a logical product circuit of a skew detector according to an embodiment of the present invention.

FIG. 6 is a timing chart in a self-calibration mode of input and output signals of a logical product circuit of a skew detector according to an embodiment of the present invention. In FIG. 6, the timings when the states of the input clock IN(x) and the input clock IN(x)' transit are defined as times t601 to t606, respectively.

As described above, the input clock IN(x) and the input clock IN(x)' are roughly the same signal, and therefore, the logical product circuit AND outputs the input clock IN(x) to the low-pass filter 1121, as the phase difference signal DIF_PH, from the time t601 to the time t606. Further, a period th from the time t601 to the time t602 and a period tl from the time t602 to the time t603 are an "H" period and an "L" period for the input clock IN(x), respectively. When the duty ratio of the input clock IN(x) is 50%, the lengths of the periods th and tl are equal, and the low-pass filter 1121 outputs one-half of the electric potential of "H," as the analog DC voltage signal Z.

Figure 7:
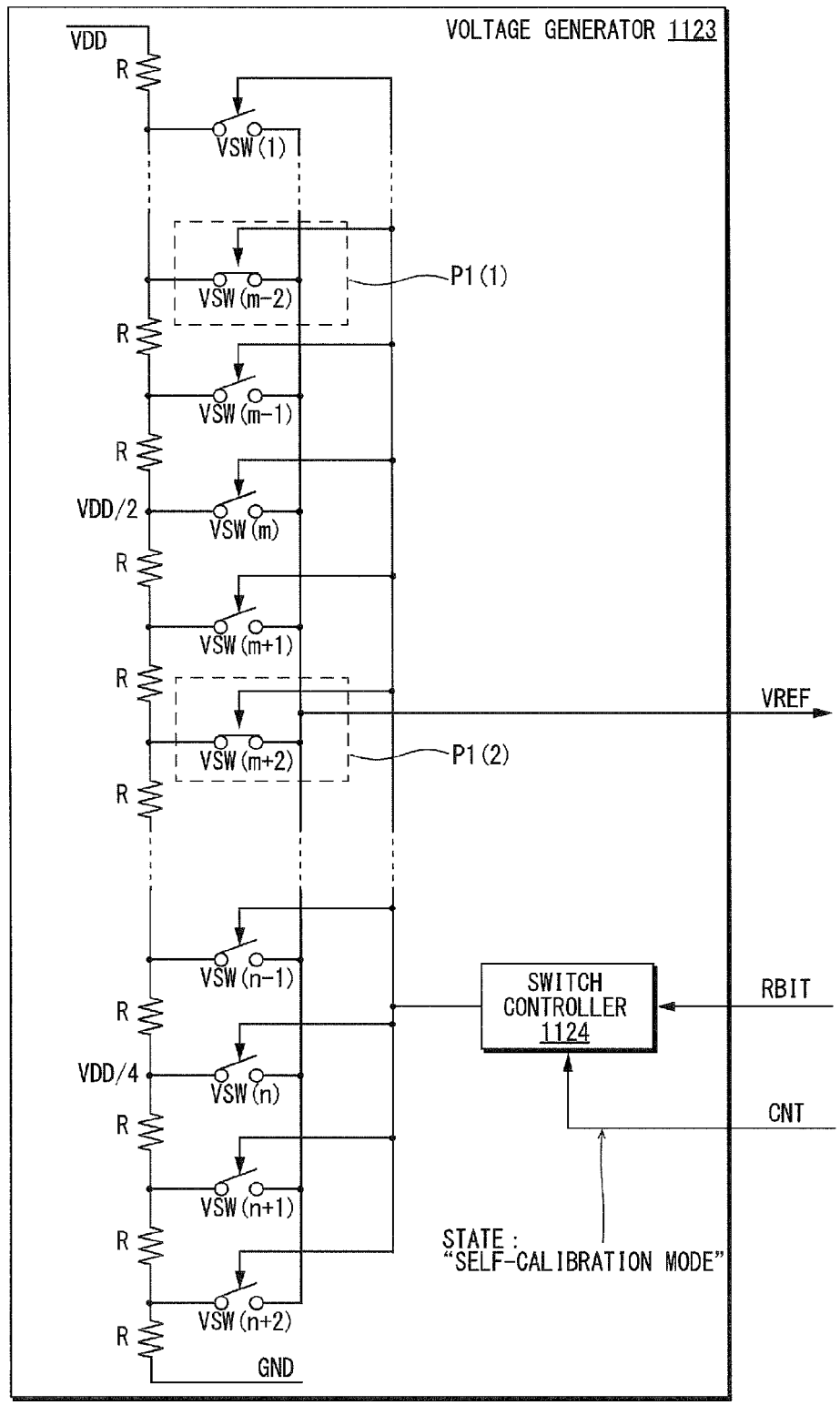
FIG. 7 is a diagram showing operation in a self-calibration mode of a voltage generator of a phase difference detector according to an embodiment of the present invention.

FIG. 7 is a diagram showing operation in a self-calibration mode of a voltage generator of a phase difference detector according to an embodiment of the present invention. As shown in FIG. 7, the controller 20 may generate the control signal CNT indicating a state being the self-calibration mode, and output the signal to the switch controller 1124.

As described above, in accordance with the state of the voltage control signal RBIT, the switch controller 1124 may turn the corresponding switch VSW on and turn the other switches VSW off, on the basis of one-half of the electric potential of the VDD (that is, the node at VDD/2 in the figure). For example, when the voltage control signal RBIT indicates a state slightly higher than one-half of the VDD, the switch controller 1124 may turn the switch VSW(m−α) on (i.e., a part P1(1) surrounded by the dashed line at an upper portion in the figure), and turn the other switches VSW off. On the other hand, for example, when the voltage control signal RBIT indicates a state slightly lower than one-half of the VDD, the switch controller 1124 may turn the switch VSW(m+α) on (i.e., a part P1(2) surrounded by the dashed line at a central portion in FIG. 7), and turn the other switches VSW off. It is noted FIG. 7 shows that the value α is 2, but without being limited to this, the value α may be an arbitrary integer.

Figure 8:
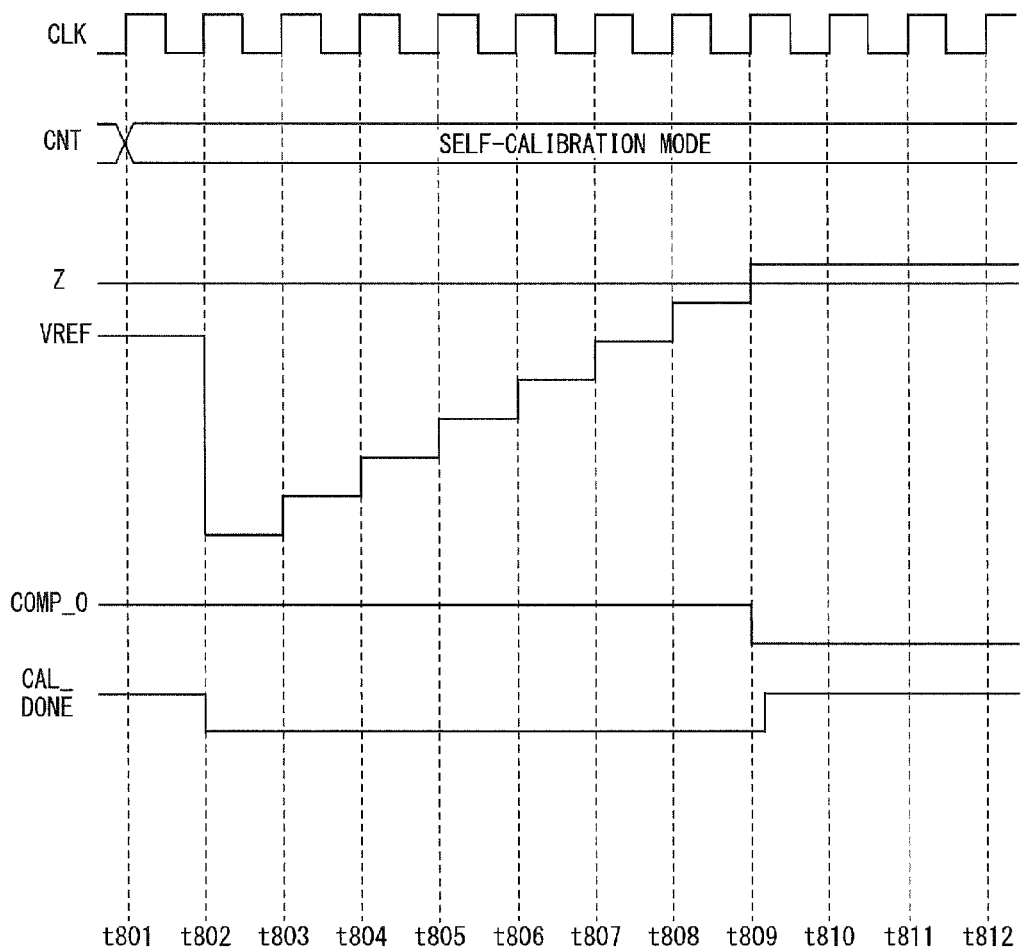
FIG. 8 is a timing chart showing operation in a self-calibration mode of a phase difference detector according to an embodiment of the present invention.

FIG. 8 is a timing chart showing the operation in the self-calibration mode of a phase difference detector according to an embodiment of the present invention. In FIG. 8, it is assumed that the voltage generator 1123 sets the electric potential of the reference voltage signal VREF to an electric potential sufficiently lower than one-half of the electric potential of "L" or "H." Further, in FIG. 8, the timings when the reference clock CLK alternates are defined as times t801 to t812, respectively.

At the time t801, the controller 20 sets the state of the control signal CNT to the self-calibration mode. At the time t802, in response to the state "self-calibration mode" of the control signal CNT, the voltage generator 1123 sets the electric potential of the reference voltage signal VREF to the electric potential sufficiently lower than one-half of the electric potential of "L" or "H." At this time, the analog DC voltage signal Z may be higher in electric potential than the reference voltage signal VREF, and therefore, the comparator COMP may output "H." Further, the voltage controller 1122 may set the state of the calibration completion signal CAL_DONE, which is an internal signal, to "L."

At the time t803, the voltage controller 1122 may raise the state of the voltage control signal RBIT by 1 LSB, and maintain "L" as the state of the calibration completion signal CAL_DONE because the voltage controller 1122 may be in the self-calibration mode. Then, the voltage generator 1123 may generate the reference voltage signal VREF in accordance with the control signal CNT and the voltage control signal RBIT raised by 1 LSB, and output it to the inverting terminal "−" of the comparator COMP. The comparator COMP may compare the electric potentials of the analog DC voltage signal Z and the reference voltage signal VREF. The electric potential of the analog DC voltage signal Z may be higher than the electric potential of the reference voltage signal VREF, and therefore, the comparator COMP may output, to the voltage controller 1122, the comparison signal COMP_O of which the electric potential is "H." At the time t804 to the time t808, the voltage controller 1122, the voltage generator 1123 and the comparator COMP may repeat the same operation as that of the time t803.

At the time t809, the voltage controller 1122 and the voltage generator 1123 may perform the same operation as that of the time t803. Then, the comparator COMP may compare the electric potentials of the analog DC voltage signal Z and the reference voltage signal VREF. In this case, the electric potential of the analog DC voltage signal z may be lower than the electric potential of the reference voltage signal VREF, and therefore, the comparator COMP may output, to the voltage controller 1122, the comparison signal COMP_O of which the electric potential is "L." At a time slightly later than the time t809, the voltage controller 1122 may transit the state of the calibration completion signal CAL_DONE from "L" to "H," and store the state of the voltage control signal RBIT in the internal resister. Then, the voltage generator 1123 may stop the operation, and the skew detector 112 may terminate the operation in the self-calibration mode.

[Description of Operation in Skew Adjustment Mode]

Figure 9:
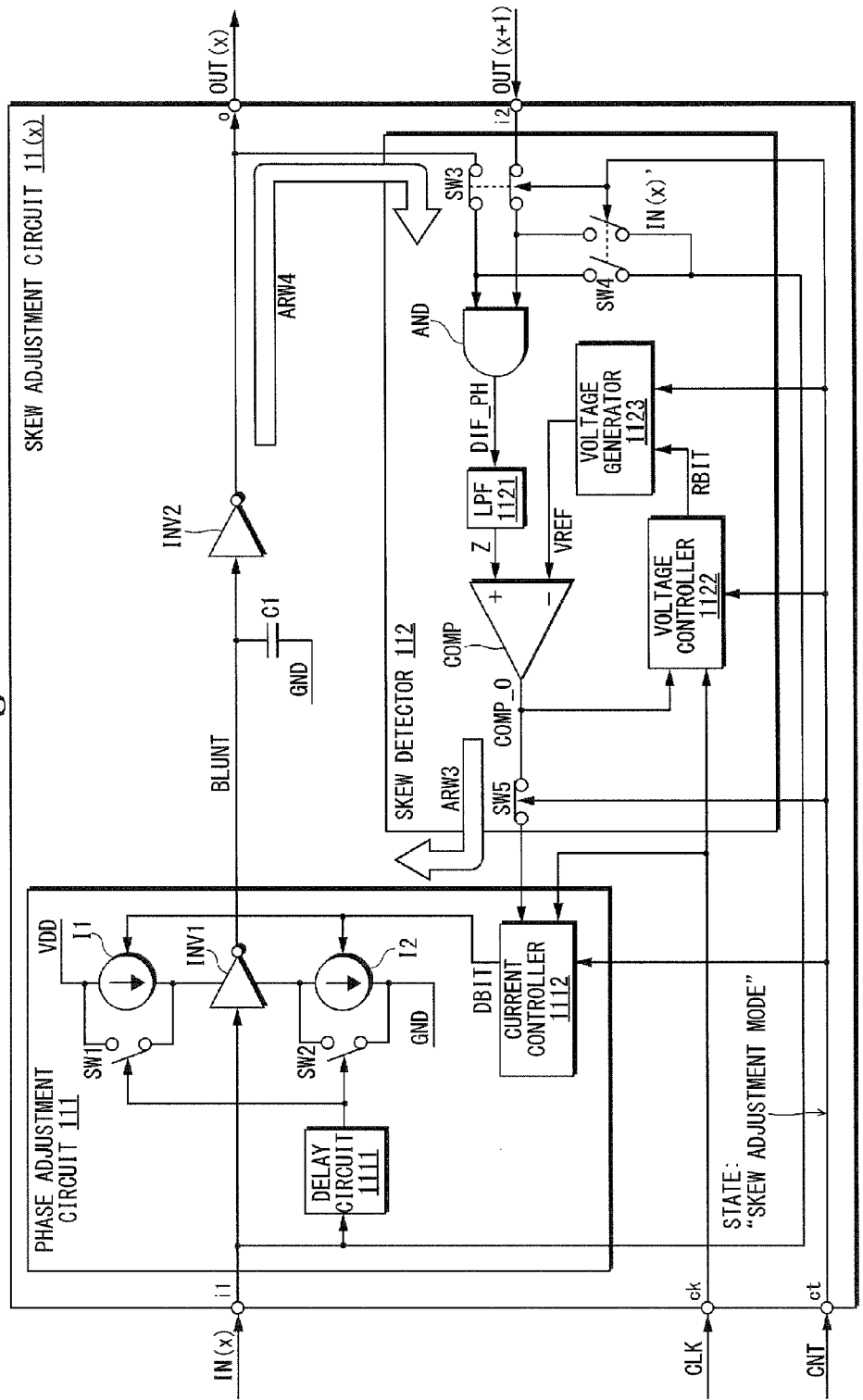
FIG. 9 is a diagram showing an example of operation in a skew adjustment mode of a skew adjustment circuit according to an embodiment of the present invention.

FIG. 9 is a diagram showing an example of operation in a skew adjustment mode of a skew adjustment circuit according to an embodiment of the present invention. As shown in FIG. 9, the controller 20 may generate the control signal CNT indicating a state being the skew adjustment mode, and may output the signal to the skew detector 112 and the current controller 1112.

The interlock switches SW3 and SW4 may turn the states "on" and "off," respectively, in accordance with the state "skew adjustment mode" of the control signal CNT. By this, the input clock IN(x) and the output clock OUT(x+1) may be input to the two input terminals of the logical product circuit AND.

The logical product circuit AND may perform the logical product for the input clock IN(x) and the output clock OUT(x+1), and output the result of the logical product to the low-pass filter 1121, as the phase difference signal DIF_PH. The logical product circuit AND may detect the skew between the input clock IN(x) and the output clock OUT(x+1), and output the result of the detection to the low-pass filter 1121, as the phase difference signal DIF_PH.

The low-pass filter 1121 may remove high frequency band from the phase difference signal DIF_PH output from the logical product circuit AND, and output it to the non-inverting terminal "+" of the comparison circuit COMP, as the analog DC voltage signal Z. In a case of a quadratic phase, the phase difference between the input clock IN(x) and the output clock OUT(x+1) is about 90°. Therefore, when both of the duty ratios of the two clocks are 50%, the low-pass filter 1121 may output about one-fourth of the electric potential of "H," as the analog DC voltage signal Z, to the non-inverting terminal "+" of the comparator COMP.

The comparator COMP may compare the electric potential of the analog DC voltage signal Z output from the low-pass filter 1121 and the electric potential of the reference voltage signal VREF output from the voltage generator 1123, and output the comparison result, as the comparison signal COMP_O, to the voltage controller 1122 and the switch SW5 (an arrow ARW3 in the figure). It is noted that the state of the switch SW5 is turned on, in accordance with the state "skew adjustment mode" of the control signal CNT.

In accordance with the state "skew adjustment mode" indicated by the control signal CNT, the voltage controller 1122 may output, to the voltage generator 1123, the voltage control signal RBIT having the result of the calibration stored in the "self-calibration mode." Then, in accordance with the state "skew adjustment mode" of the control signal CNT, the voltage generator 1123 may generate the reference voltage signal VREF in accordance with the state of the voltage control signal RBIT output from the voltage controller 1122, based on one-fourth of the electric potential of the power line VDD, and output the signal to the inverting terminal "−" of the comparator COMP.

The current controller 1112 may determine the state of the comparison signal COMP_O output from the comparator COMP, in accordance with the state "skew adjustment mode" indicated by the control signal CNT. In a case of determination that the state of the comparison signal COMP_O is "L," the current controller 1112 may raise the state of the phase control signal DBIT by 1 LSB, output the signal to the current sources I1 and I2 of the phase adjustment circuit 111, and set the state of the calibration completion signal CAL_DONE, which is an internal signal, to "L." Then, the phase adjustment circuit 111 may generate the blunt clock BLUNT in accordance with the state of the phase control signal DBIT output from the current controller 1112, and output the clock to one of the input terminals of the logical product circuit AND (an arrow ARW4 in the figure).

The current controller 1112 and the phase adjustment circuit 111 may execute such operation repeatedly until the state of the comparison signal COMP_O becomes "H." That is, the signals of the skew adjustment circuit 11(x) in the skew adjustment mode may pass through paths shown by the arrows ARW3 and ARW4. In a case of determining that the state of the comparison signal COMP_O is "H," the current controller 1112 may store the state of the phase control signal DBIT in the internal resister, and transit the state of the calibration completion signal CAL_DONE, which is an internal signal, from "L" to "H." Then, the current controller 1112 may stop the operation, and the skew adjustment circuit 11 may terminate the operation of the skew adjustment mode.

Figure 10:
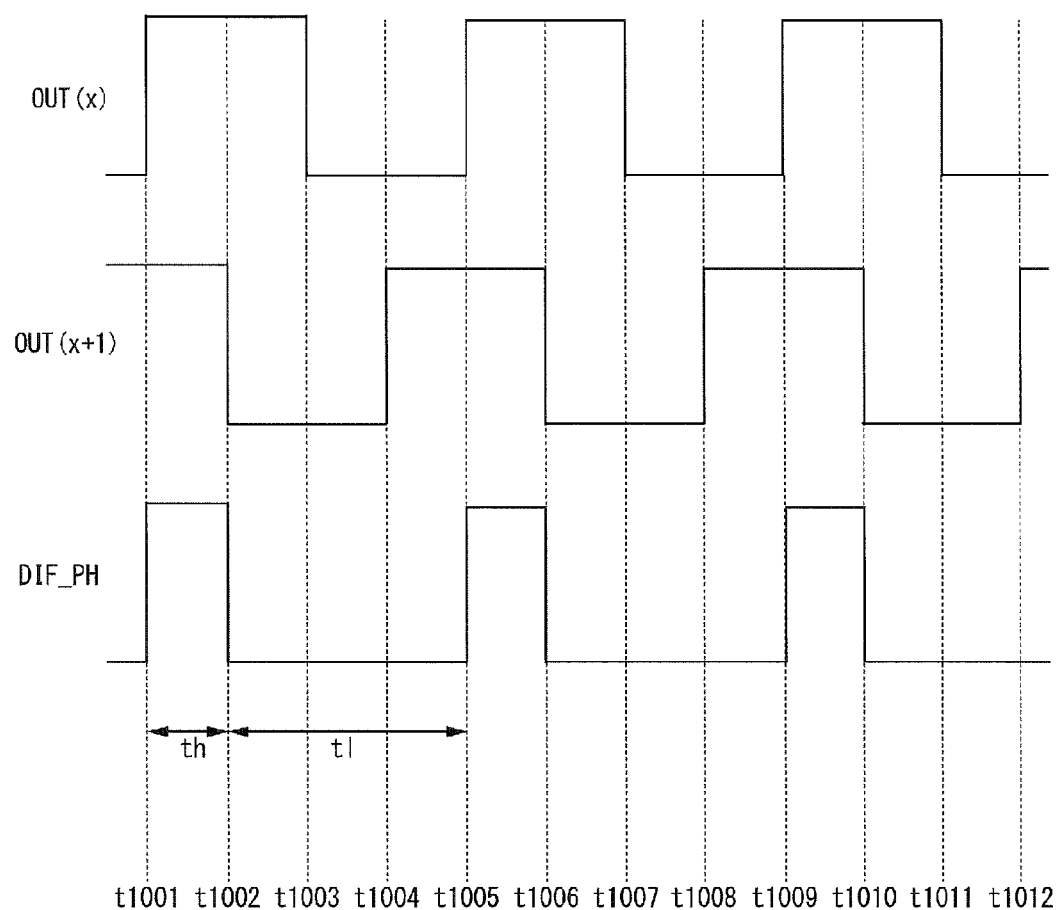
FIG. 10 is a timing chart in a skew adjustment mode of input and output signals of a logical product circuit of a skew adjustment circuit according to an embodiment of the present invention.

FIG. 10 is a timing chart in a skew adjustment mode of input and output signals of a logical product circuit of a skew detector according to an embodiment of the present invention. In FIG. 10, the timings when the states of the input clock IN(x) and the output clock OUT(x) transit are defined as times t1001 to t1012, respectively.

As described above, in a case of a quadratic phase, the input clock IN(x) and the output clock OUT(x) have a phase difference of about 90°, and therefore, the logical product circuit AND may output, to the low-pass filter 1121, the phase difference signal DIF_PH in which the state is "H" from the time t1001 to the time t1002 and the state is "L" from the time t1002 to the time t1005. Further, a period th from the time t1001 to the time t1002 and a period tl from the time t1002 to the time t1005 are an "H" period and an "L" period for the input clock IN(x), respectively. When the duty ratio of the input clock IN(x) is, for example, 50%, the period th may be about one-fourth of the total length of the period th and the period tl, and the low-pass filter 1121 may output one-fourth of the electric potential of "H," as the analog DC voltage signal Z.

Figure 11:
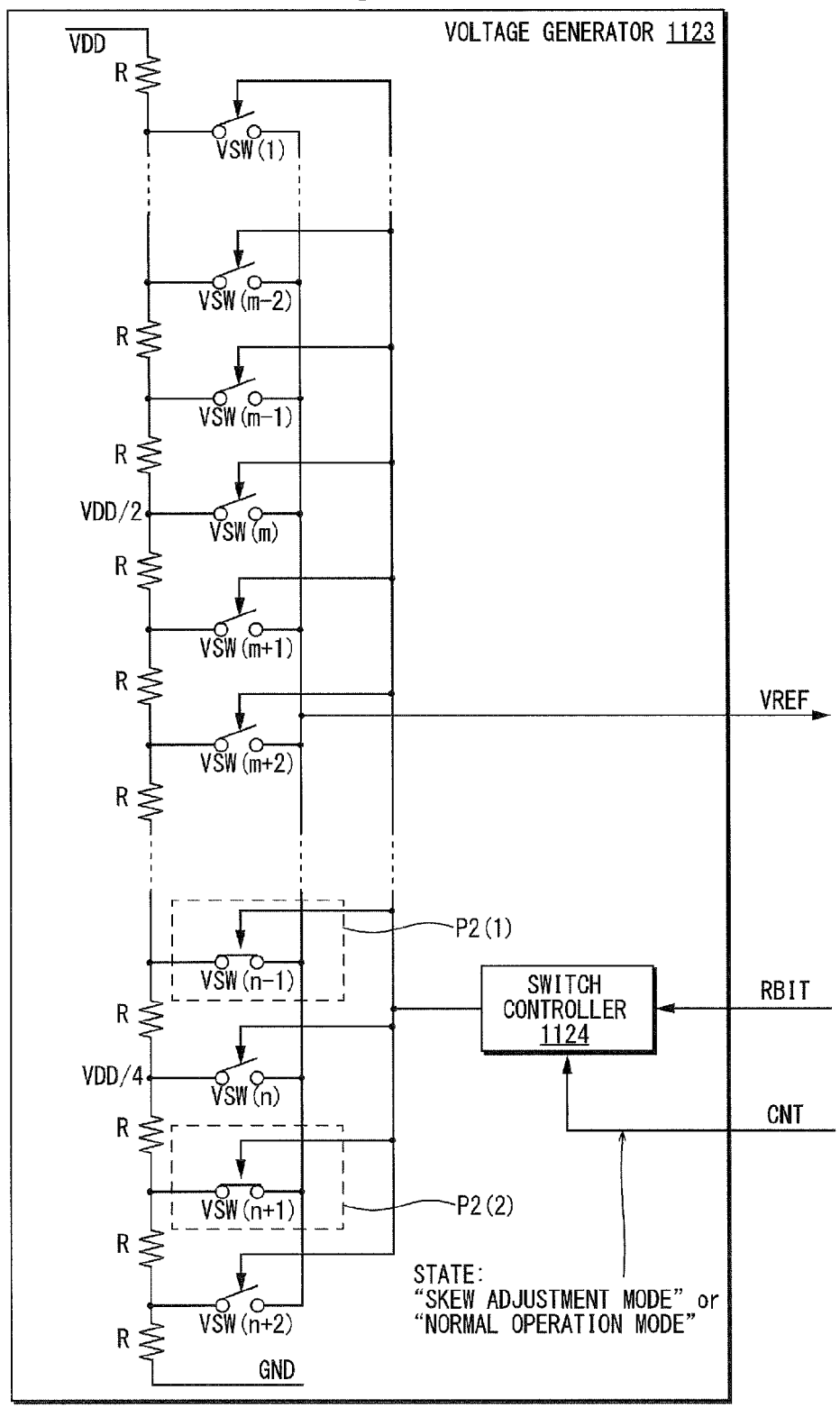
FIG. 11 is a diagram showing operation in a skew adjustment mode of a voltage generator of a skew detector according to an embodiment of the present invention.

FIG. 11 is a diagram showing the operation in a skew adjustment mode of a voltage generator of a skew detector according to an embodiment of the present invention. As shown in FIG. 11, the controller 20 may generate the control signal CNT indicating the state being the skew adjustment mode, and may output the signal to the switch controller 1124.

As described above, in accordance with the state of the voltage control signal RBIT, the switch controller 1124 may turn the corresponding switch VSW on and may turn the other switches VSW off, on the basis of one-fourth of the electric potential of the VDD (i.e., the node at VDD/4 in FIG. 11). For example, when the voltage control signal RBIT indicates a state slightly higher than one-fourth of the VDD, the switch controller 1124 may turn the switch VSW(n−α/2) on (i.e., a part P2(1) surrounded by the dashed line at a central portion in FIG. 11), and turn the other switches VSW off. On the other hand, for example, when the voltage control signal RBIT indicates a state slightly lower than one-fourth of the VDD, the switch controller 1124 may turn the switch VSW(n+α/2) on (i.e., a part P2(2) surrounded by the dashed line at a lower portion in FIG. 11), and turn the other switches VSW off. As shown, the value α/2 is 1. However, this is consistently an example, and the value α/2 may be an arbitrary value.

Figure 12:
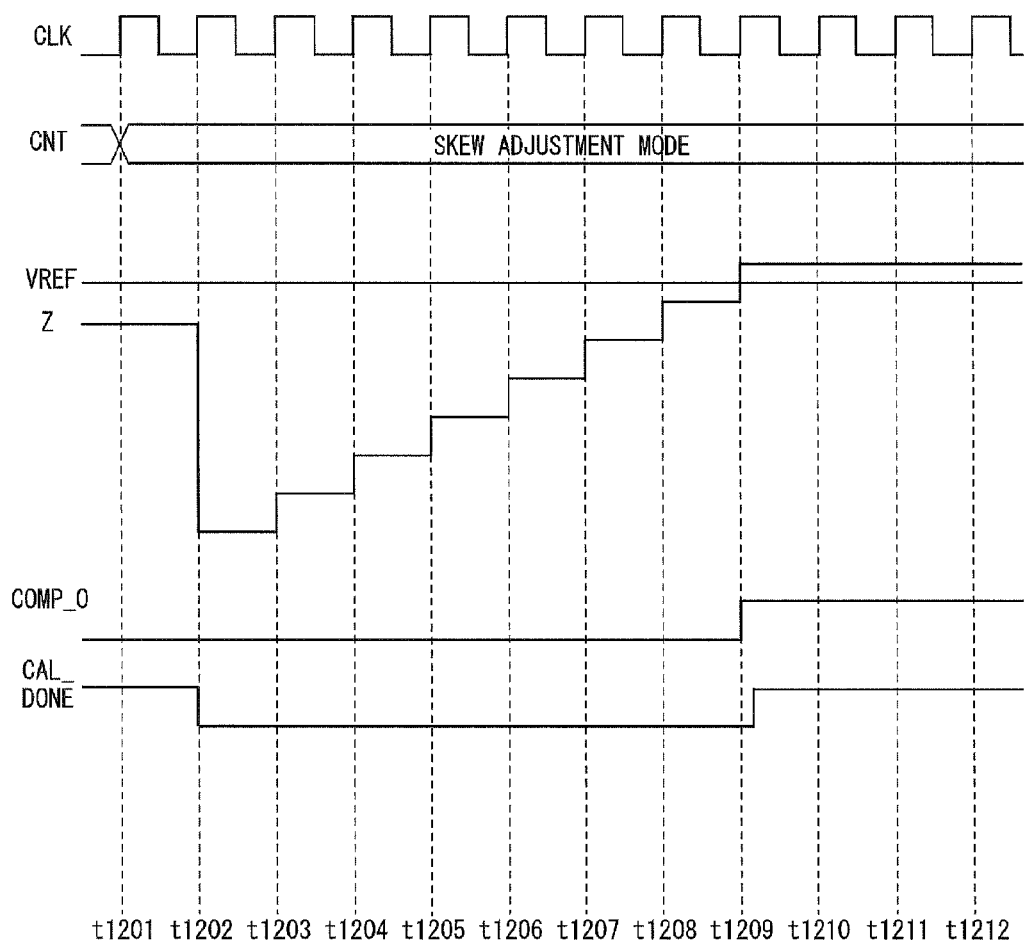
FIG. 12 is a timing chart showing operation in a skew adjustment mode of a skew detector according to an embodiment of the present invention.

FIG. 12 is a timing chart showing operation in a skew adjustment mode of a skew detector according to an embodiment of the present invention. In FIG. 12, it is assumed that the current controller 1112 sets the electric potential of the phase control signal DBIT to an electric potential sufficiently lower than one-fourth of the electric potential of "L" or "H." Further, the timings when the reference clock CLK alternates are defined as times t1201 to t1212, respectively.

At the time t1201, the controller 20 may set the state of the control signal CNT to the skew adjustment mode. At the time t1202, in response to the state "skew adjustment mode" of the control signal CNT, the current controller 1112 may set the electric potential of the phase controls signal DBIT to the electric potential sufficiently lower than one-fourth of the electric potential of "L" or "H." Since the analog DC voltage signal Z is lower in electric potential than the reference voltage signal VREF, the comparator COMP may output "L." Further, the current controller 1112 may set the state of the calibration completion signal CAL_DONE, which is an internal signal, to "L."

At the time t1203, the current controller 1112 may raise the state of the phase control signal DBIT by 1 LSB, and maintain "L" as the state of the calibration completion signal CAL_DONE. Then, the current controller 1112 may output the phase control signal DBIT raised by 1 LSB, to the current sources I1 and I2 of the phase adjustment circuit 111. The phase adjustment circuit 111 may add, to the input clock IN(x), a blunting in accordance with the phase control signal DBIT, and output the clock, as the blunt clock BLUNT, to one of the input terminals of the logical product circuit AND through the logical negation circuit INV2. Then, the comparator COMP may compare the electric potentials of the analog DC voltage signal Z input from the logical product circuit AND through the low-pass filter 1121 and the reference voltage signal VREF. Since the electric potential of the analog DC voltage signal Z is lower than the electric potential of the reference voltage signal VREF, the comparator COMP may output, to the current controller 1112, the comparison signal COMP_O of which the electric potential is "L." At the time t1204 to the time t1208, the phase adjustment circuit 111, the skew detector 112 and the current controller 1112 may repeat the same operation as that of the time t1203.

At the time t1209, the phase adjustment circuit 111 and the current controller 1112 may perform the same operation as that of the time t1203. Then, the comparator COMP may compare the electric potentials of the analog DC voltage signal Z and the reference voltage signal VREF. In this case, the electric potential of the analog DC voltage signal Z may be higher than the electric potential of the reference voltage signal VREF, and therefore, the comparator COMP may output, to the current controller 1112, the comparison signal COMP_O of which the electric potential is "H." At a time slightly later than the time t1209, the current controller 1112 may transit the state of the calibration completion signal CAL_DONE from "L" to "H," and store the state of the phase control signal DBIT in the internal resister. Then, the current controller 1112 may terminate the operation in the skew adjustment mode.

[Description of Operation in Normal Operation Mode]

Back to FIG. 2, the operation when the controller 20 sets the state of the control signal to the "normal operation mode" will be described. The interlock switches SW3 and SW4 and the switch SW5 may turn the states "off," in accordance with the state "normal operation mode" of the control signal CNT. Thus, in the normal operation mode, the skew detector 112 may stop the operation.

In accordance with the state "normal operation mode" of the control signal CNT, the current controller 1112 may output, to the phase adjustment circuit 111, the phase control signal DBIT having the result of the calibration stored in the skew adjustment mode. The phase adjustment circuit 111 may add, to the input clock IN(x), a blunting in accordance with the phase control signal DBIT output from the current controller 1112, and output the clock to the logical negation circuit INV2, as the blunt clock BLUNT. The logical negation circuit INV2 may perform the logical negation for the blunt clock BLUNT, and output the result of the logical negation to the exterior, as the output clock OUT(x).

[Description of Whole Operation Including Each Mode]

Figure 13A:
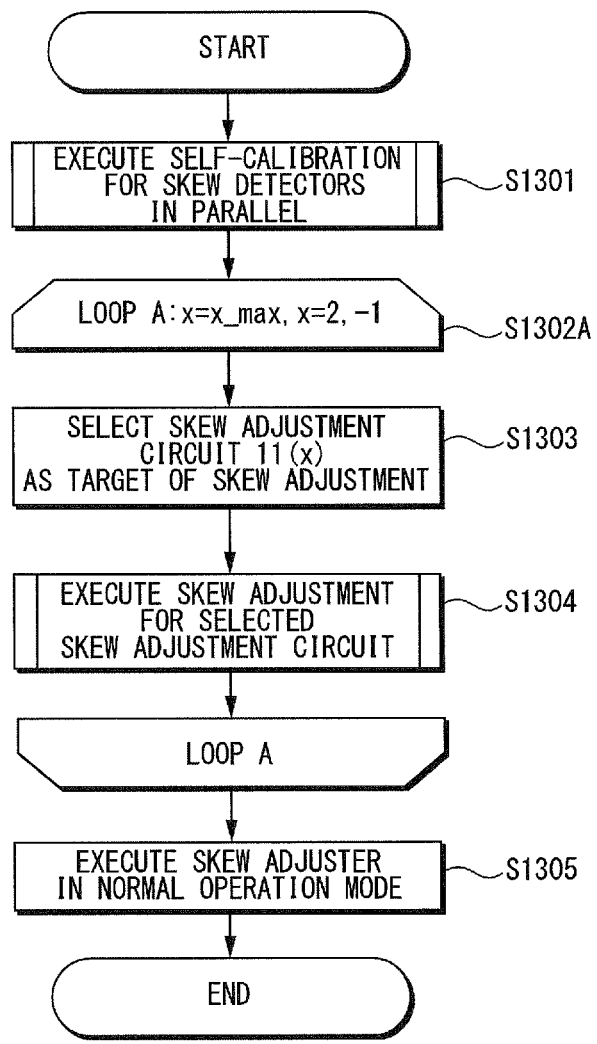
FIG. 13A is a flowchart for schematically showing a skew adjustment method of a multiphase skew adjustment circuit according to an embodiment of the present invention.

FIG. 13A is a flowchart for schematically showing a skew adjustment method of a multiphase skew adjustment circuit according to an embodiment of the present invention. Specifically, FIG. 13A is a flowchart showing a method for adjusting a skew between multiphase input clocks IN with the multiphase skew adjustment circuit 10 according to an embodiment of the present invention. Hereinafter, the multiphase skew adjustment circuit 10 including the four skew adjustment circuits 11(1) to 11(4) will be described as an example.

First, the controller 20 may set the skew detector 112 of each skew adjustment circuit 11(x), to the self-calibration mode, and may execute the operation in the self-calibration mode (step S1301). Such operation is typically executed in parallel or concurrently, but may be executed sequentially. The detail of the process of each skew detector 112 in the process of step S1301 will be described with reference to FIG. 14.

After the self-calibration of the skew detector 112 of each skew adjustment circuit 11(x) is completed, the controller 20 may execute the skew adjustment between the two clocks input to each skew adjustment circuit 11(x), in a predetermined order (loop A: S1302A to S1304). That is, the controller 20 may perform control such that the skew adjustment is performed in descending order from the skew adjustment circuit 11(4) at the last stage to the skew adjustment circuit 11(2) at the next stage of the first stage.

More specifically, the controller 20, first, may select one skew adjustment circuit 11(x) for which the skew adjustment is to be performed (S1303). Subsequently, the controller 20 may set the selected skew adjustment circuit 11(x) to the skew adjustment mode, and adjust the skew between the input clock IN(x) and the output clock OUT(x+1) that are input to the skew adjustment circuit 11(x) (S1304). The detail of the process of step S1304 will be described with reference to FIG. 15.

When the skew adjustment for the selected skew adjustment circuit is completed, the controller 20 may decrement the value of x by one, in order to select one skew adjustment circuit 11(x) for which the skew adjustment is to be performed next, and may return to the process of step S1303. The controller 20 may repeat the above processes until the skew adjustment for all skew adjustment circuits 11 is completed.

Finally, the multiphase skew adjustment circuit 10 may set each skew adjustment circuit 11 to the normal operation mode. The multiphase skew adjustment circuit 10 may adjust the skew for the multiphase input clocks IN, in accordance with the setting performed in the processes of steps S1301 to S1304, and then output the multiphase output clocks OUT (S1305).

Figure 13B:
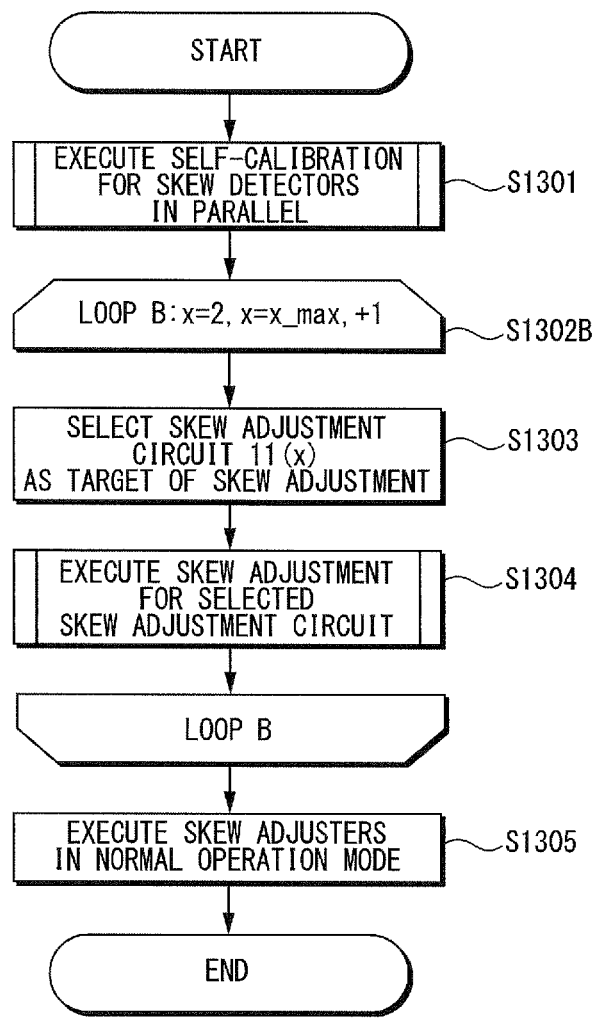
FIG. 13B is a flowchart for schematically showing a skew adjustment method of a multiphase skew adjustment circuit according to an embodiment of the present invention.

FIG. 13B is a flowchart for schematically showing a skew adjustment method of a multiphase skew adjustment circuit according to an embodiment of the present invention. Specifically, FIG. 13B is a flowchart showing a method for adjusting a skew between multiphase input clocks IN with the multiphase skew adjustment circuit 10' according to an embodiment of the present invention. It is noted that the method for adjusting the skew between the multiphase input clocks IN with the multiphase skew adjustment circuit 10' is different from the method with the multiphase skew adjustment circuit 10, only in the order of the selection of the skew adjustment circuit 11(x), and the processes of step S1301, and steps S1303 to S1305 are the same as the processes described in FIG. 13A. Thus, the descriptions of the processes are appropriately omitted.

After the self-calibration of the skew detector 112 of each skew adjustment circuit 11(x) is completed in the process of step S1301, the controller 20 may execute the skew adjustment between the two clocks input to each skew adjustment circuit 11(x), in a predetermined order (loop B: S1302B to S1304). That is, the controller 20 may perform control such that the skew adjustment is performed in ascending order from the skew adjustment circuit 11(2) at the second stage to the skew adjustment circuit 11(*x*) at the last stage.

More specifically, the controller 20, first, may select one skew adjustment circuit 11(*x*) for which the skew adjustment is to be performed (S1303). Subsequently, the controller 20 may set the selected skew adjustment circuit 11(*x*) to the skew adjustment mode, and adjust the skew between the input clock IN and the output clock OUT that are input to the skew adjustment circuit 11(*x*) (S1304). The detail of the process of step S1304 will be described with reference to FIG. 15.

When the skew adjustment for the selected skew adjustment circuit 11(*x*) is completed, the controller 20 may increment the value of x by one, in order to select one skew adjustment circuit 11(*x*) for which the skew adjustment is to be performed next, and then return to the process of step S1303. The controller 20 may repeat the above processes until the skew adjustment for all skew adjustment circuits 11 is completed.

Finally, the multiphase skew adjustment circuit 10' may set each skew adjustment circuit 11 to the normal operation mode. The multiphase skew adjustment circuit 10' may adjust the skew for the multiphase input clocks IN, in accordance with the setting performed in the processes of steps S1301 to S1304, and output the multiphase output clocks OUT (S1305).

Figure 14:
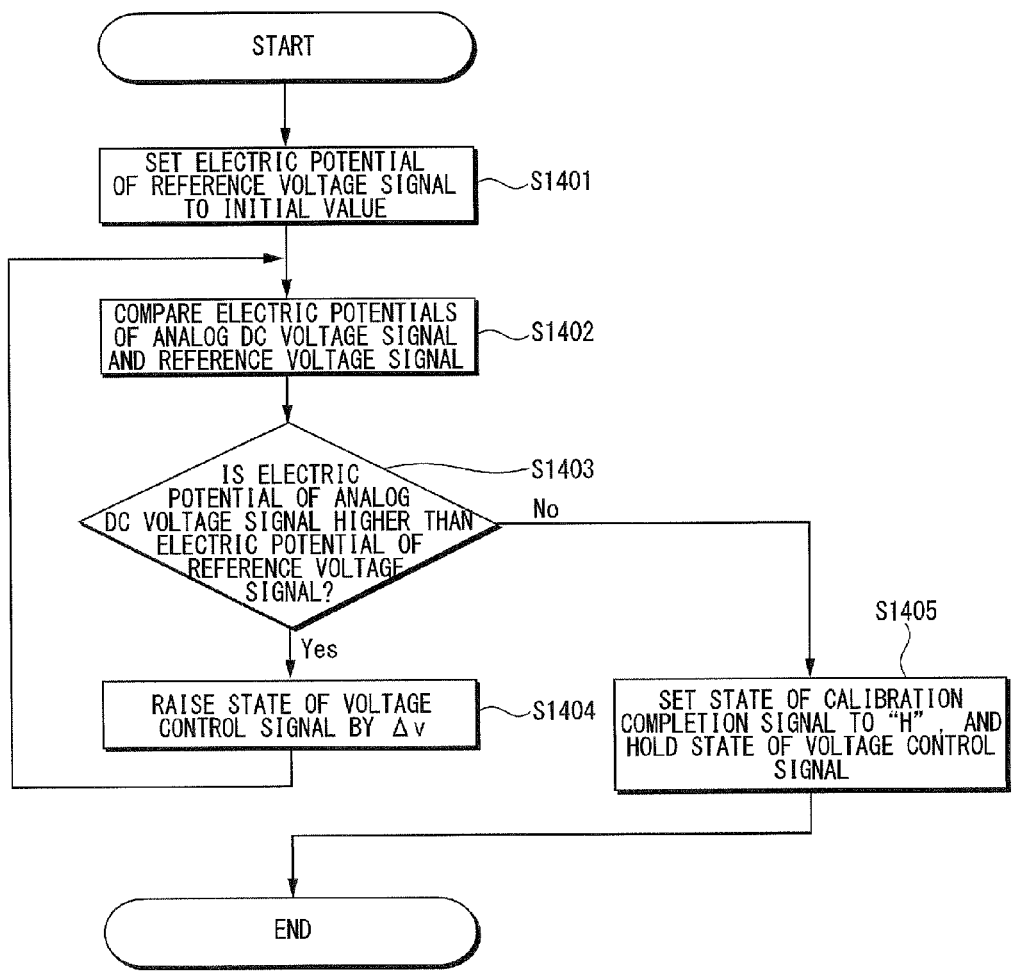
FIG. 14 is a flowchart for schematically showing operation in the self-calibration mode of a skew adjustment circuit according to an embodiment of the present invention.

FIG. 14 is a flowchart for schematically showing operation in a self-calibration mode of a skew adjustment circuit according to an embodiment of the present invention, and shows the detail of the process of step S1301 in FIGS. 13A and 13B.

First, the selected skew adjustment circuit 11(*x*) may set the electric potential of the reference voltage signal VREF to an initial value (for example, 0 V) (S1401). Next, the skew adjustment circuit 11(*x*) may compare the electric potential of the analog DC voltage signal Z output by the low-pass filter 1121 and the electric potential of the reference voltage signal VREF output by the voltage generator 1123 (S1402).

Subsequently, in a case of determining that the electric potential of the analog DC voltage signal Z is higher than the electric potential of the reference voltage signal VREF as a result of the comparison in the process of step S1402 (Yes in S1403), the skew adjustment circuit 11(*x*) may raise the electric potential of the voltage control signal RBIT output by the voltage controller 1122, by the predetermined value Δv (e.g., a value shown as 1 LSB (Least Significant Bit)) (S1404), and may return to the process of step S1402. On the other hand, in a case of determining that the electric potential of the analog DC voltage signal Z is lower than the electric potential of the reference voltage signal VREF, the skew adjustment circuit 11(*x*) may set the state of the calibration completion signal CAL_DONE, which is an internal signal of the voltage controller 1122, to "H," and store the state of the voltage control signal RBIT in the internal resister (S1405). Then, the skew adjustment circuit 11(*x*) may terminate the operation in the self-calibration mode, and then return to the former flow.

Figure 15:
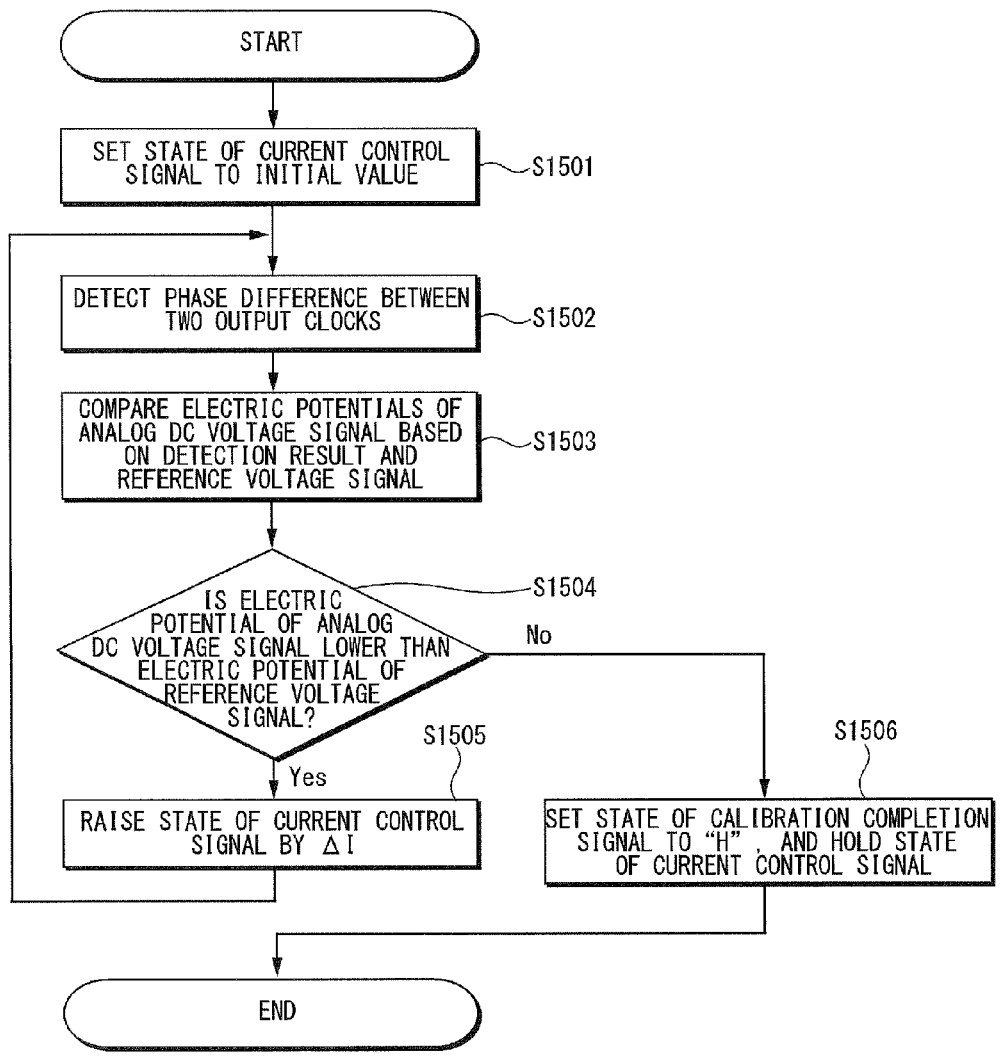
FIG. 15 is a flowchart for schematically showing operation in a skew adjustment mode of a skew adjustment circuit according to an embodiment of the present invention.

FIG. 15 is a flowchart for schematically showing operation in a skew adjustment mode of a skew adjustment circuit according to an embodiment of the present invention, and shows the detail of the process of step S1304 in FIGS. 13A and 13B.

First, the selected skew adjustment circuit 11(*x*) may set the state of the phase control signal DBIT to an initial value (for example, a value that maximizes or minimizes the blunting degree of the blunt clock BLUNT output by the phase adjustment circuit 111) (S1501). Next, the logical product circuit AND may detect the skew between the output clock OUT(x) and the output clock OUT input from another skew adjustment circuit 11(*x*) to the input terminal i2 (S1502). The skew adjustment circuit 11 may then compare the electric potential of the analog DC voltage signal Z generated by the low-pass filter 1121 based on the skew detected by the logical product circuit AND and the electric potential of the reference voltage signal VREF output by the voltage generator 1123 (S1503).

In a case of determining that the electric potential of the analog DC voltage signal Z is lower than the electric potential of the reference voltage signal VREF as a result of the comparison in the process of step S1503 (Yes in S1504), the skew adjustment circuit 11(*x*) may raise the state of the phase control signal DBIT output by the current controller 1112, by ΔI (for example, a value shown as 1 LSB) (S1505), and return to the process of step S1502. On the other hand, in a case of determining that the electric potential of the analog DC voltage signal Z is higher than the electric potential of the reference voltage signal VREF (No in S1504), the skew adjustment circuit 11(*x*) may set the state of the calibration completion signal CAL_DONE, which is an internal signal of the current controller 1112, to "H," store the state of the phase control signal DBIT in the internal resister (S1506), terminate the operation in the skew adjustment mode, and then return to the former flow.

Next, the operation when the multiphase skew adjustment circuit 10 adjusts the skew between the multiphase clocks will be described with reference to timing charts shown in FIGS. 16-20. FIGS. 16-20 are timing charts of various signals in a multiphase skew adjustment circuit according to an embodiment.

Figure 16:
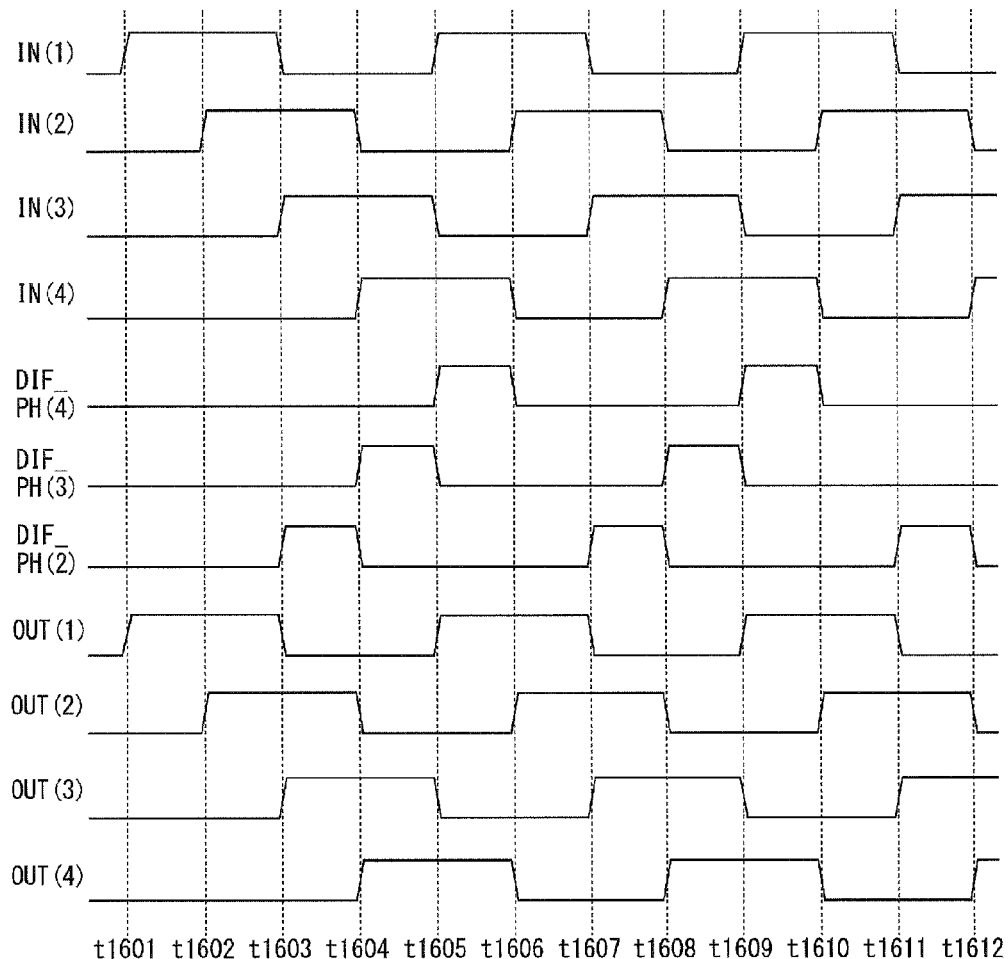
FIG. 16 is a timing chart of various signals in a multiphase skew adjustment circuit according to the embodiment.

Specifically, FIG. 16 is a timing chart of various signals in a case where there is no skew among the multiphase clocks IN(1) to IN(4) in the multiphase skew adjustment circuit 10 according to an embodiment. In FIG. 16, the timings when the clocks transit the states in the case where there is no skew among the input clocks IN(1) to IN(4) are defined as times t1601 to t1612, respectively.

As shown in FIG. 16, the input clocks IN(1) to IN(4) have a phase difference of 90° from each other. Therefore, the skew adjustment circuits 11(1) to 11(4) may output the output clocks OUT(1) to OUT(4) having a phase difference of 90° from each other.

Until the time t1605, the logical product circuit AND of the skew adjustment circuit 11(4) may output the phase difference signal DIF_PH(4) indicating the state being "L," because the state of either of the input clock IN(4) and the output clock OUT(1) is "L." Then, at the time t1605, the logical product circuit AND of the skew adjustment circuit 11(4) may detect the states "H" of the two clocks, and set the state of the phase difference signal DIF_PH to "H." Further, from the time t1606 to the time t1609, the logical product circuit AND of the skew adjustment circuit 11(4) may set the state of the phase difference signal DIF_PH(4) to "L," because the state of either of the two clocks is "L." From the time t1609 to the time t1612, the logical product circuit AND of the skew adjustment circuit 11(4) may perform the same operation as that of the time t1605 to the time t1608.

Until the time t1604, the logical product circuit AND of the skew adjustment circuit 11(3) may output the phase difference signal DIF_PH(3) indicating the state being "L," because the state of either of the input clock IN(3) and the output clock OUT(4) is "L." Then, at the time t1604, the logical product circuit AND of the skew adjustment circuit 11(3) may detect the states "H" of the two clocks, and may set the state of the phase difference signal DIF_PH to "H." Further, from the time t1605 to the time t1608, the logical product circuit AND of the skew adjustment circuit 11(3) may set the state of the phase difference signal DIF_PH(3) to "L," because the state of either of the two clocks is "L." From the time t1608 to the time t1611, the logical product circuit AND of the skew adjustment circuit 11(3) may perform the same operation as that of the time t1604 to the time t1607.

Until the time t1603, the logical product circuit AND of the skew adjustment circuit 11(2) may output the phase difference signal DIF_PH(2) indicating the state being "L," because the state of either of the input clock IN(2) and the output clock OUT(3) is "L." Then, at the time t1603, the logical product circuit AND of the skew adjustment circuit 11(2) may detect the states "H" of the two clocks, and set the state of the phase difference signal DIF_PH to "H." Further, from the time t1604 to the time t1607, the logical product circuit AND of the skew adjustment circuit 11(2) may set the state of the phase difference signal DIF_PH(2) to "L," because the state of either of the two clocks is "L." From the time t1607 to the time t1610, the logical product circuit AND of the skew adjustment circuit 11(2) may perform the same operation as that of the time t1603 to the time t1606.

Figure 17:
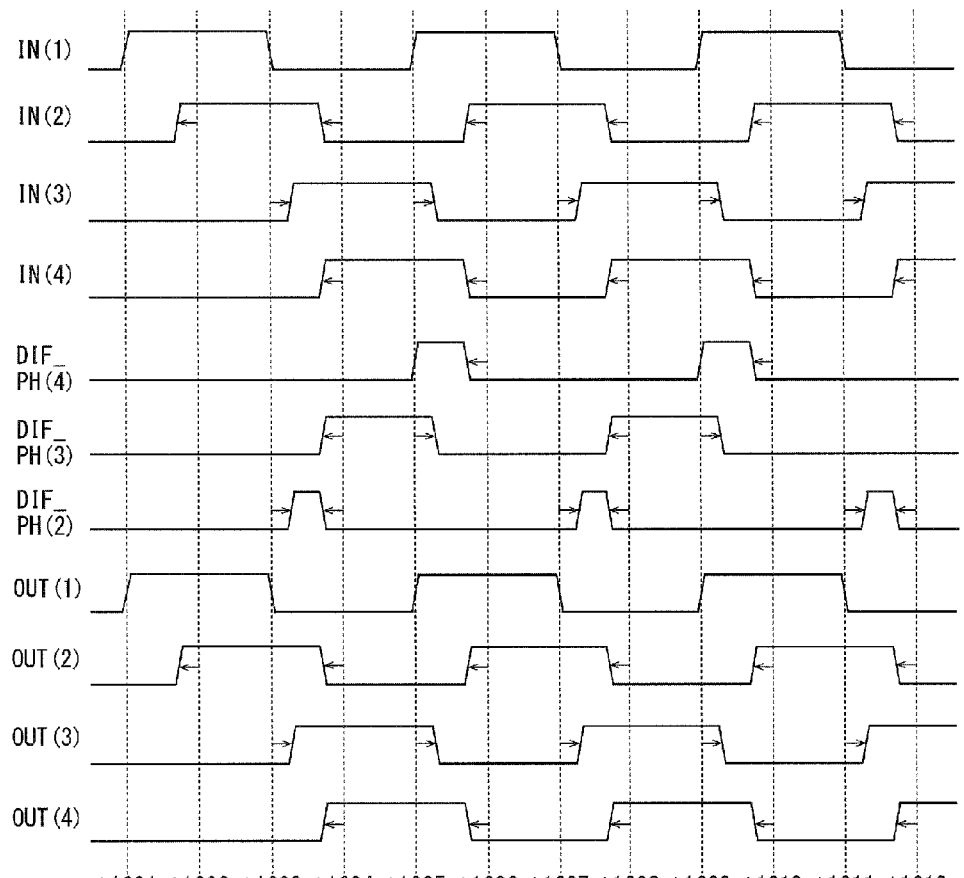
FIG. 17 is a timing chart of various signals in a multiphase skew adjustment circuit according to the embodiment.

FIG. 17 is a timing chart of various signals in a case where there are skews among the multiphase clocks IN(1) to IN(4) in the multiphase skew adjustment circuit 11 according to an embodiment. The times t1601 to t1612 in FIG. 17 are the same as the description in FIG. 16, and therefore, the description may be omitted.

As shown in FIG. 17, the input clocks IN(2) and IN(4) may have slightly advanced phases compared to the case where there is no skew (see FIG. 16), and the input clock IN(3) may have a slightly delayed phase compared to the case where there is no skew.

Therefore, it is found that the "H" period of the phase difference signal DIF_PH(4) output by the logical product circuit AND of the skew adjustment circuit 11(4) may become slightly shorter, the "H" period of the phase difference signal DIF_PH(3) output by the logical product circuit AND of the skew adjustment circuit 11(3) may become slightly longer, and the "H" period of the phase difference signal DIF_PH(2) output by the logical product circuit AND of the skew adjustment circuit 11(2) may become slightly shorter.

Further, in a case where the skew adjustment between the multiphase clocks is not performed, the multiphase output clocks OUT output by the multiphase skew adjustment circuit 10 are the same as the input clocks IN, and therefore, it is found that the output clocks OUT(2) and OUT(4) may have slightly advanced phases compared to the case where there is no skew, and the output clock OUT(3) may have a slightly delayed phase compared to the case where there is no skew.

Figure 18:
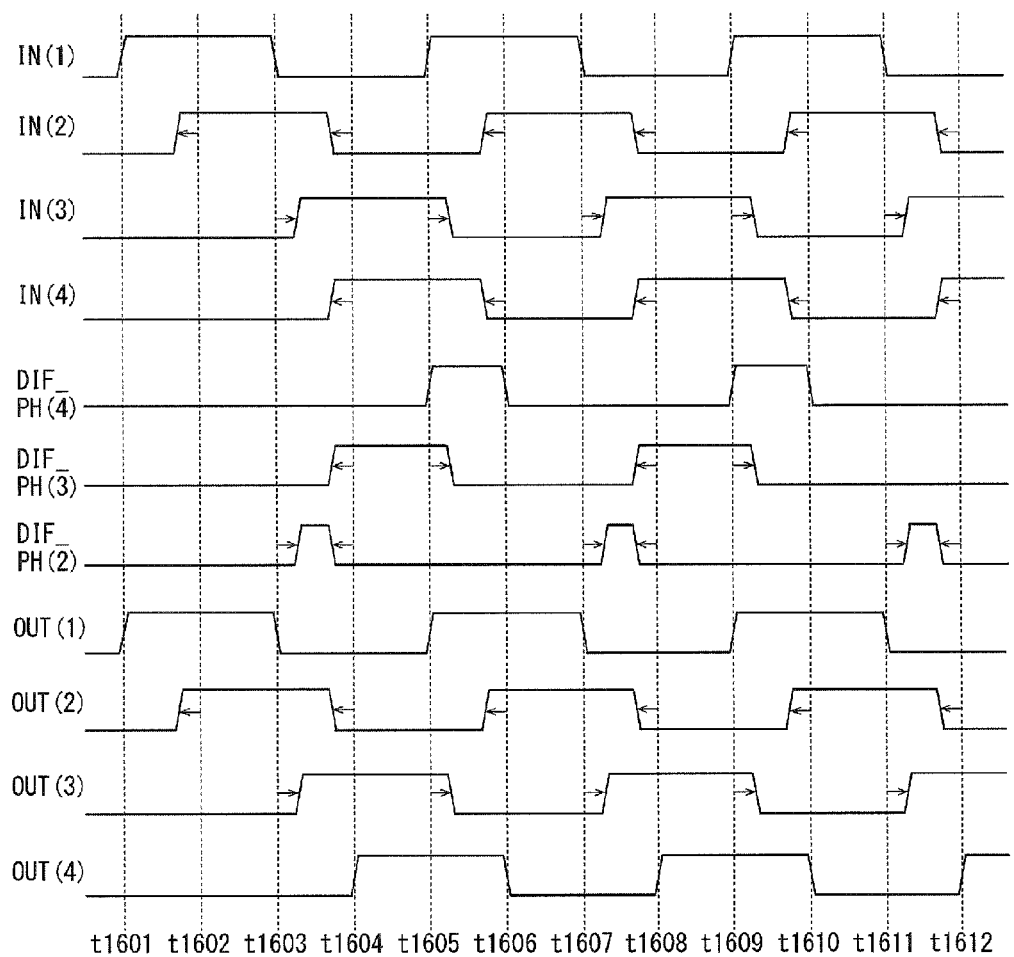
FIG. 18 is a timing chart of various signals in a multiphase skew adjustment circuit according to the embodiment.

FIG. 18 is a timing chart of various signals when skew adjustment is performed for the skew adjustment circuit 11(4) in a case where there are skews among the multiphase clocks IN(1) to IN(4) in the multiphase skew adjustment circuit 10 according to the embodiment. The times t1601 to t1612 in FIG. 18 are the same as the description in FIG. 16, and therefore, the description may be omitted.

As shown in FIG. 18, the input clocks IN(2) and IN(4) may have slightly advanced phases compared to the case where there is no skew (see FIG. 16), and the input clock IN(3) may have a slightly delayed phase compared to the case where there is no skew.

Therefore, it is found that the "H" period of the phase difference signal DIF_PH(3) output by the logical product circuit AND of the skew adjustment circuit 11(3) may become slightly longer, and the "H" period of the phase difference signal DIF_PH(2) output by the logical product circuit AND of the skew adjustment circuit 11(2) may become slightly shorter. Meanwhile, in the skew adjustment circuit 11(4), the current controller 1112 may adjust the phase of the input clock IN(4) such that the integration value of the logical product for the input clock IN(4) and the output clock OUT(1) is VDD/4. Thus, the waveform of the phase difference signal DIF_PH(4) output by the logical product circuit AND of the skew adjustment circuit 11(4) may change from the waveform shown in FIG. 17 into the waveform shown in FIG. 18 after a certain period, and as a result, there may become no difference in the "H" period of the signal, from the case where there is no skew (that is, FIG. 16).

Further, it is found that the output clock OUT(2) may have a slightly advanced phase compared to the case where there is no skew, and the output clock OUT(3) may have a slightly delayed phase compared to the case where there is no skew. Meanwhile, it is found that the output clock OUT(4) may have no particular difference from the case where there is no skew, because the skew is adjusted by the above-described operation.

Figure 19:
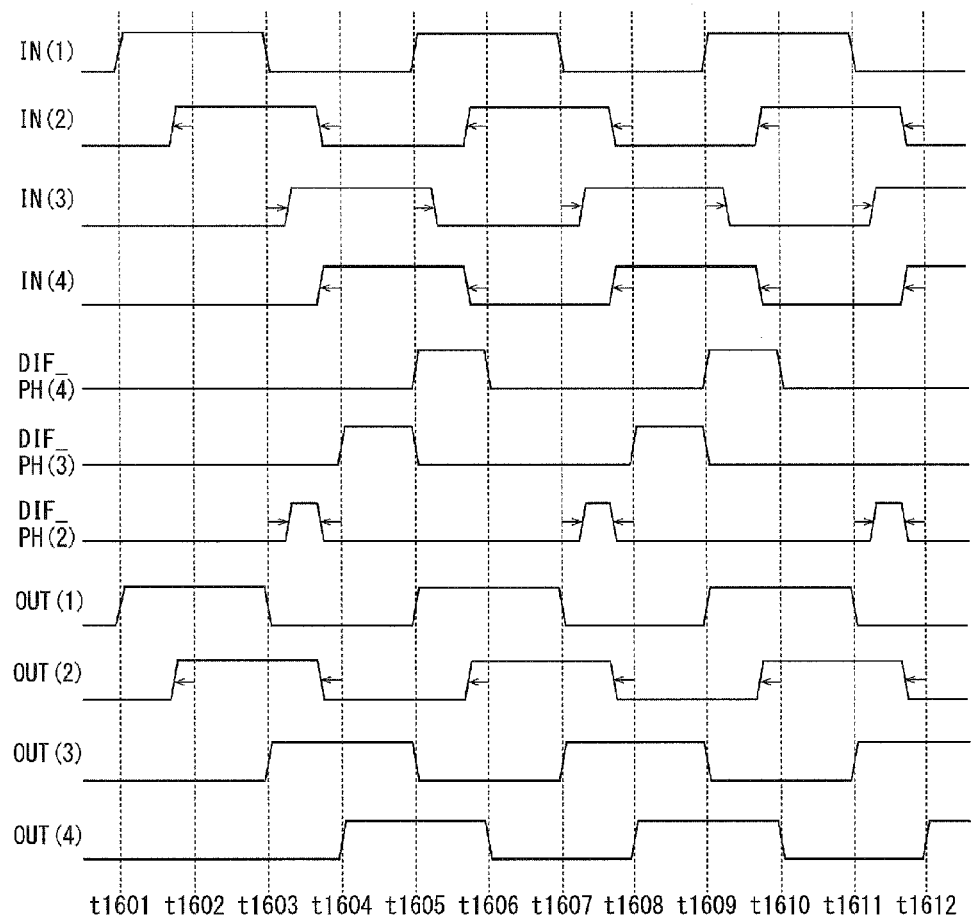
FIG. 19 is a timing chart of various signals in a multiphase skew adjustment circuit according to the embodiment.

FIG. 19 is a timing chart of various signals when skew adjustment is performed for the skew adjustment circuits 11(3) and 11(4) in a case where there are skews among the multiphase clocks IN(1) to IN(4) in the multiphase skew adjustment circuit 10 according to an embodiment. The times t1601 to t1612 in FIG. 19 are the same as the description in FIG. 16, and therefore, the description may be omitted.

As shown in FIG. 19, the input clocks IN(2) and IN(4) may have slightly advanced phases compared to the case where there is no skew (see FIG. 16), and the input clock IN(3) may have a slightly delayed phase compared to the case where there is no skew.

Therefore, it is found that the "H" period of the phase difference signal DIF_PH(2) output by the logical product circuit AND of the skew adjustment circuit 11(2) may become slightly shorter. Meanwhile, as for the "H" periods of the phase difference signals DIF_PH(3) and DIF_PH(4) output by the logical product circuits AND of the skew adjustment circuits 11(3) and 11(4) for which the skew adjustment has been performed, it is found that there may become no difference from the case where there is no skew, because the skews are adjusted by the above-described operation.

Further, it is found that the output clock OUT(2) may have a slightly advanced phase compared to the case where there is no skew. Meanwhile, it is found that the output clocks OUT(3) and OUT(4) may have no particular difference from the case where there is no skew, because the skews are adjusted by the above-described operation.

Figure 20:
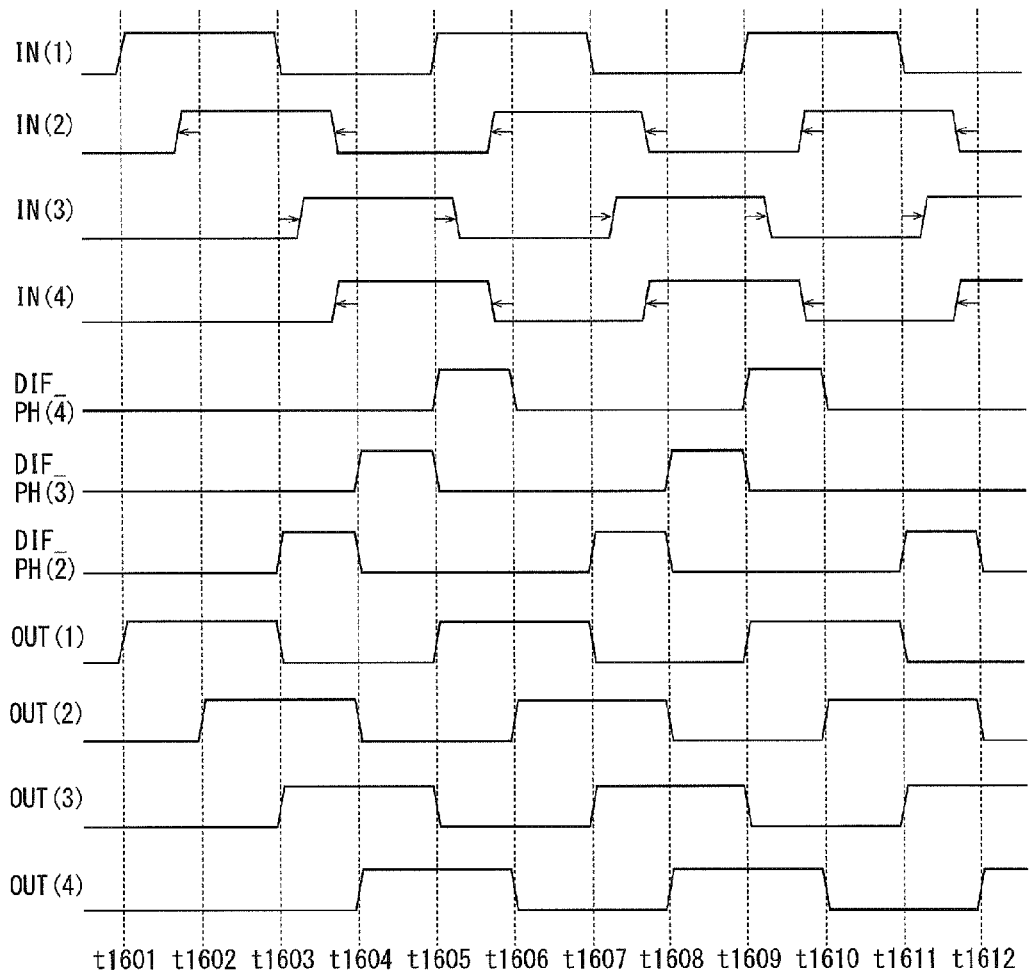
FIG. 20 is a timing chart of various signals in a multiphase skew adjustment circuit according to the embodiment.

FIG. 20 is a timing chart of various signals when skew adjustment is performed for the skew adjustment circuits 11(2) to 11(4) in a case where there are skews among the multiphase clocks IN(1) to IN(4) in the multiphase skew adjustment circuit 10 according to an embodiment. The times t1601 to t1612 in FIG. 20 are the same as the description in FIG. 16, and therefore, the description may be omitted.

As shown in FIG. 20, the input clocks IN(2) and IN(4) may have slightly advanced phases compared to the case where there is no skew (see FIG. 16), and the input clock IN(3) may have a slightly delayed phase compared to the case where there is no skew.

However, as for the "H" periods of the phase difference signals DIF_PH(2) to DIF_PH(4) output by the logical product circuits AND of the skew adjustment circuits 11(2) to 11(4) for which the skew adjustment has been performed, it is found that there may be no difference from the case where there is no skew, because the skews are adjusted by the above-described operation. Further, it is found that the output clocks OUT(2) to OUT(4) may have no particular difference from the case where there is no skew, because the skews are adjusted by the above-described operation.

FIG. 21 is a timing chart of various signals in a multiphase skew adjustment circuit according to an embodiment. Specifically, FIG. 21 is timing chart of various signals when the skew adjustment is performed for the skew adjustment circuits 11(2) to 11(4) in a case where the phase of the input clock IN(2) is purposely deviated so as to be advanced or delayed in the multiphase skew adjustment circuit 10 according to the embodiment.

As shown in FIG. 21, it is found that, even in a case where the phase of the input clock IN(2) is deviated so as to be advanced or delayed, the output clock OUT(2) may be output similarly to the case where there is no skew (i.e., so as to have a phase difference of 180° from the output clock OUT(4)).

As described above, the multiphase skew adjustment circuit 10 may execute the self-calibration by setting the skew adjustment circuits 11 to the self-calibration mode, and subsequently, execute the skew adjustment by setting them to the skew adjustment mode in order from the skew adjustment circuit 11 at the subsequent stage of the first stage or at the last stage. By this, it is possible to suppress the skew between the multiphase clocks. Furthermore, the skew adjustment circuit 11 may have the self-calibration function that calibrates the property variation of itself, and further detect the skew between the multiphase clocks with the logical product circuit AND. Therefore, it is possible to adjust, with high accuracy, the skew generated between the multiphase clocks in a semiconductor integrated circuit that operates at a very high speed.

The above embodiments are examples for describing the present invention, and it is not intended that the present invention is limited only to the embodiments. The present invention can be implemented in a variety of modes, without departing from the spirit.

For example, in the method disclosed in the specification, the steps, operations or functions may be implemented concurrently or in different orders, as long as there is no inconsistency in the result. The described steps, operations and functions have been provided as just examples. In the scope without departing from the spirit of the present invention, some of the steps, operations and functions can be omitted or can be combined with each other into one, and other steps, operations or functions may be added.

Further, in the specification, which has disclosed a variety of embodiments, a particular feature (technical matter) in an embodiment can be appropriately improved, and therewith, can be added to an alternative embodiment or can replace by the particular feature in the alternative embodiment. Such modes also fall within the spirit of the present invention.

The present invention can be widely used in the field of semiconductor integrated circuits.

What is claimed is:

1. A skew adjustment circuit comprising:
   a phase adjustment circuit that adjusts a phase of a first input clock based on a predetermined phase control signal, and outputs the adjusted first input dock as an output clock;
   a logical circuit that performs a logical operation between signals that are input;
   an integral circuit that generates a predetermined voltage signal based on a result of the logical operation by the logical circuit;
   a comparator that compares an electric potential of the predetermined voltage signal and an electric potential of a predetermined reference voltage signal;
   a phase adjustment amount controller that generates the predetermined phase control signal based on a result of the comparison by the comparator; and
   a controller that performs control to select a signal to be input to the logical circuit,
   wherein the controller, in a first mode, performs control such that the output clock and a second input clock are selected.

2. The skew adjustment circuit according to claim 1, wherein the logical circuit performs a logical product between the signals that are input.

3. The skew adjustment circuit according to claim 1, wherein
   the skew adjustment circuit further comprises a voltage controller that generates the predetermined reference voltage signal based on the result of the comparison,
   the controller, in a second mode, performs control such that the first input clock is selected, and
   the voltage controller performs control so as to raise the electric potential of the predetermined reference voltage signal by a predetermined value when the result of the comparison indicates that the electric potential of the predetermined voltage signal is greater than the electric potential of the predetermined reference voltage signal, and to hold the electric potential of the predetermined reference voltage signal when the result of the comparison indicates that the electric potential of the predetermined voltage signal is not greater than the electric potential of the predetermined reference voltage signal.

4. The skew adjustment circuit according to claim 1, wherein the phase adjustment amount controller performs control so as to raise an electric potential of the predetermined phase control signal by a predetermined value when the result of the comparison indicates that the electric potential of the predetermined voltage signal is greater than the electric potential of the predetermined reference voltage signal, and to hold the electric potential of the predetermined phase control signal when the result of the comparison indicates that the electric potential of the predetermined voltage signal is not greater than the electric potential of the predetermined reference voltage signal.

5. A multiphase skew adjustment circuit comprising a plurality of skew adjustment circuits each of which adjusts a skew between multiphase clocks, the multiphase clocks having a predetermined phase difference from each other, wherein each of the plurality of skew adjustment circuits comprises:
   a first input terminal;
   a second input terminal;
   an output terminal;
   a phase adjustment circuit that adjusts a phase of a first input clock that is input to the first input terminal based on a predetermined comparison signal, and outputs the adjusted first input clock from the output terminal as an output clock;

a logical circuit that performs a logical operation between the output clock and a second input clock that is input to the second input terminal;

an integral circuit that generates a predetermined voltage signal based on a result of the logical operation by the logical circuit;

a comparator that compares an electric potential of the predetermined voltage signal and an electric potential of a predetermined reference voltage signal; and a phase adjustment amount controller that generates the predetermined phase control signal based on a result of the comparison by the comparator, wherein one skew adjustment circuit is configured to receive, through the first input terminal, the first input clock having a predetermined phase difference relative to a first input clock that is input to the first input terminal of the skew adjustment circuit at the previous stage, and to receive, through the second input terminal, the output clock that is output from the output terminal of the skew adjustment circuit at the subsequent stage.

6. The multiphase skew adjustment circuit according to claim 5, wherein the logical circuit performs a logical product between the output clock and the second input clock that is input to the second input terminal.

7. The multiphase skew adjustment circuit according to claim 5, wherein the skew adjustment circuit at the last stage of the plurality of skew adjustment circuits is configured to receive, through the second input terminal, the output clock that is output from the output terminal of the skew adjustment circuit at the first stage.

8. A multiphase skew adjustment circuit comprising a plurality of skew adjustment circuits, each of which adjusts a skew between multiphase clocks, the multiphase clocks having a predetermined phase difference from each other, wherein each of the plurality of skew adjustment circuits comprises:

a first input terminal;

a second input terminal;

an output terminal;

a phase adjustment circuit that adjusts a phase of a first input clock that is input to the first input terminal based on a predetermined comparison signal, and outputs the adjusted first input clock from the output terminal as an output clock;

a logical circuit that performs a logical operation between the output clock and a second input clock that is input to the second input terminal;

an integral circuit that generates a predetermined voltage signal, based on a result of the logical operation by the logical circuit;

a comparator that compares an electric potential of the predetermined voltage signal and an electric potential of a predetermined reference voltage signal; and a phase adjustment amount controller that generates the predetermined phase control signal, based on a result of the comparison by the comparator, wherein one skew adjustment circuit receives, through the first input terminal, the first input clock having a predetermined phase difference relative to a first input clock that is input to the first input terminal of the skew adjustment circuit at the previous stage, and receives, through the second input terminal, the output clock that is output from the output terminal of the skew adjustment circuit at the previous stage.

9. The multiphase skew adjustment circuit according to claim 8, wherein the logical circuit performs a logical product between the output clock and the second input clock that is input to the second input terminal.

10. The multiphase skew adjustment circuit according to claim 8, wherein the multiphase skew adjustment circuit is configured such that a desired electric potential is input to the second input terminal of the skew adjustment circuit at the first stage that is the one skew adjustment circuit.

11. A method for adjusting a skew between multiphase clocks in a multiphase skew adjustment circuit comprising a plurality of skew adjustment circuits that are connected in a multistage manner, the method comprising:

adjusting a skew between an input clock that is input to a skew adjustment circuit that performs a skew adjustment and an output clock from another skew adjustment circuit that is input to the skew adjustment circuit, wherein the adjusting the skew includes:

first adjusting a skew between an input clock that is input to the skew adjustment circuit at the last stage and an output clock that is output from the skew adjustment circuit at the first stage and that is input to the skew adjustment circuit at the last stage; and second adjusting a skew between an input clock that is input to one skew adjustment circuit and an output clock that is output from the skew adjustment circuit at the subsequent stage of the one skew adjustment circuit and that is input to the one skew adjustment circuit, and wherein the second adjusting the skew is repeated in descending order from the skew adjustment circuit at the previous stage of the last stage.

12. The method according to claim 11, further comprising:

calibrating a predetermined phase control signal in each of the plurality of skew adjustment circuits, wherein the calibrating comprises:

setting an electric potential of a predetermined reference voltage signal to an initial value;

comparing an electric potential of a predetermined voltage signal and the electric potential of the predetermined reference voltage signal, the electric potential of the predetermined voltage signal being based on a first input clock that is input externally; and raising the electric potential of the predetermined reference voltage signal by a predetermined value, when the electric potential of the predetermined voltage signal is greater than the electric potential of the predetermined reference voltage signal as a result of the comparison, wherein the comparing and the raising are repeated until the electric potential of the predetermined voltage signal becomes not greater than the electric potential of the predetermined reference voltage signal as a result of the comparison, and wherein the electric potential of the predetermined reference voltage signal is held when the electric potential of the predetermined voltage signal becomes not greater than the electric potential of the predetermined reference voltage signal as a result of the comparison.

13. The method according to claim 11, wherein the adjusting the skew comprises:

setting a phase of the input clock that is input to the skew adjustment circuit that performs the skew adjustment, to an initial value;

outputting the input clock that is input to the skew adjustment circuit as an output clock;

detecting a phase difference between the output clock and the output clock from another skew adjustment circuit that is input to the skew adjustment circuit that performs the skew adjustment;

comparing an electric potential of a predetermined voltage signal and an electric potential of a predetermined reference voltage signal, the electric potential of the predetermined voltage signal being based on the detected phase difference; and altering the phase of the input clock that is input to the skew adjustment circuit, by a predetermined value, when the electric potential of the predetermined voltage signal is greater than the electric potential of the predetermined reference voltage signal as a result of the comparison, wherein the detecting of the phase difference, the comparing and the altering are repeated until the electric potential of the predetermined voltage signal becomes not greater than the electric potential of the predetermined reference voltage signal as a result of the comparison, and wherein the phase of the input clock that is input to the skew adjustment circuit that performs the skew adjustment is held when the electric potential of the predetermined voltage signal is not greater than the electric potential of the predetermined reference voltage signal as a result of the comparison.

14. A method for adjusting a skew between multiphase clocks in a multiphase skew adjustment circuit comprising a plurality of skew adjustment circuits that are connected in a multistage manner, the method comprising:

adjusting a skew between an input clock that is input to one skew adjustment circuit and an output clock that is output from the skew adjustment circuit at the previous stage of the one skew adjustment circuit and that is input to the one skew adjustment circuit, wherein the adjusting is repeated in ascending order from the skew adjustment circuit at the subsequent stage of the first stage.

* * * * *